(12) United States Patent
Lee

(10) Patent No.: US 12,154,660 B2
(45) Date of Patent: Nov. 26, 2024

(54) SEMICONDUCTOR MEMORY DEVICE AND METHOD OF MANUFACTURING SEMICONDUCTOR MEMORY DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 563 days.

(21) Appl. No.: 17/360,976

(22) Filed: Jun. 28, 2021

(65) Prior Publication Data
US 2022/0199135 A1    Jun. 23, 2022

(30) Foreign Application Priority Data
Dec. 22, 2020    (KR) .................. 10-2020-0181055

(51) Int. Cl.
| | |
|---|---|
| G11C 8/14 | (2006.01) |
| H01L 23/528 | (2006.01) |
| H10B 41/10 | (2023.01) |
| H10B 41/27 | (2023.01) |
| H10B 41/41 | (2023.01) |
| H10B 43/10 | (2023.01) |
| H10B 43/27 | (2023.01) |
| H10B 43/40 | (2023.01) |

(52) U.S. Cl.
CPC ............ *G11C 8/14* (2013.01); *H01L 23/5283* (2013.01); *H10B 41/10* (2023.02); *H10B 41/27* (2023.02); *H10B 41/41* (2023.02); *H10B 43/10* (2023.02); *H10B 43/27* (2023.02); *H10B 43/40* (2023.02)

(58) Field of Classification Search
CPC ............... G11C 8/14; H10B 41/20–27; H10B 43/20–27; H10B 53/20; H10B 51/20; H10B 63/84–845; H10B 41/41; H01B 20/40; H01B 20/50; H01B 20/65
See application file for complete search history.

(56) References Cited

U.S. PATENT DOCUMENTS 9,972,641 B1 *   5/2018   Zhang ................. H01L 29/0847

FOREIGN PATENT DOCUMENTS

KR    1020150139255 A    12/2015

* cited by examiner

*Primary Examiner* — Amar Movva
(74) *Attorney, Agent, or Firm* — WILLIAM PARK & ASSOCIATES LTD.

(57) ABSTRACT

The present disclosure relates to a semiconductor memory device and a method of manufacturing the semiconductor memory device. The semiconductor memory device includes a word line, a first select line on the word line, a second select line on the first select line, a first upper contact extending to be in contact with a first surface of the first select line, and a second upper contact extending through the second select line to be in contact with a second surface of the first select line, wherein the first surface and the second surface of the first select line are on opposites sides of each other.

21 Claims, 18 Drawing Sheets

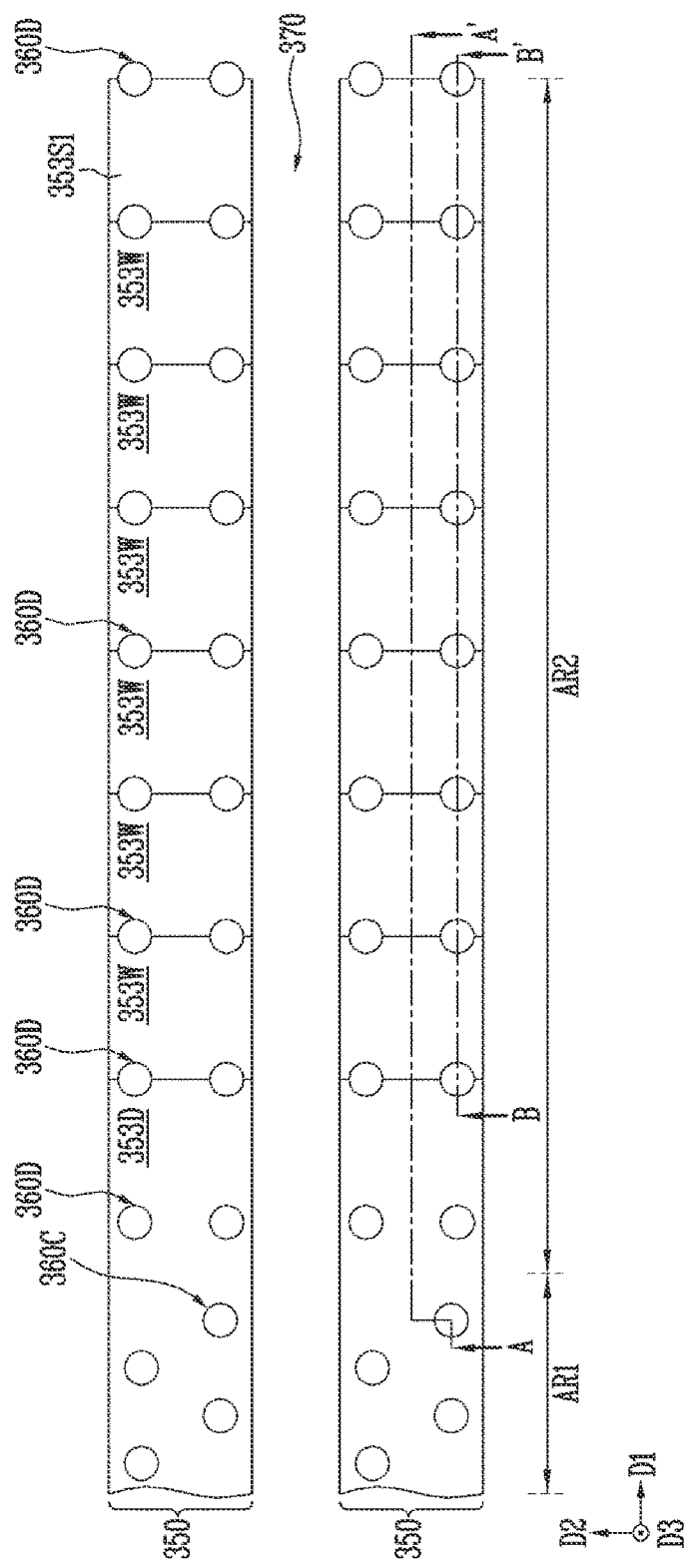

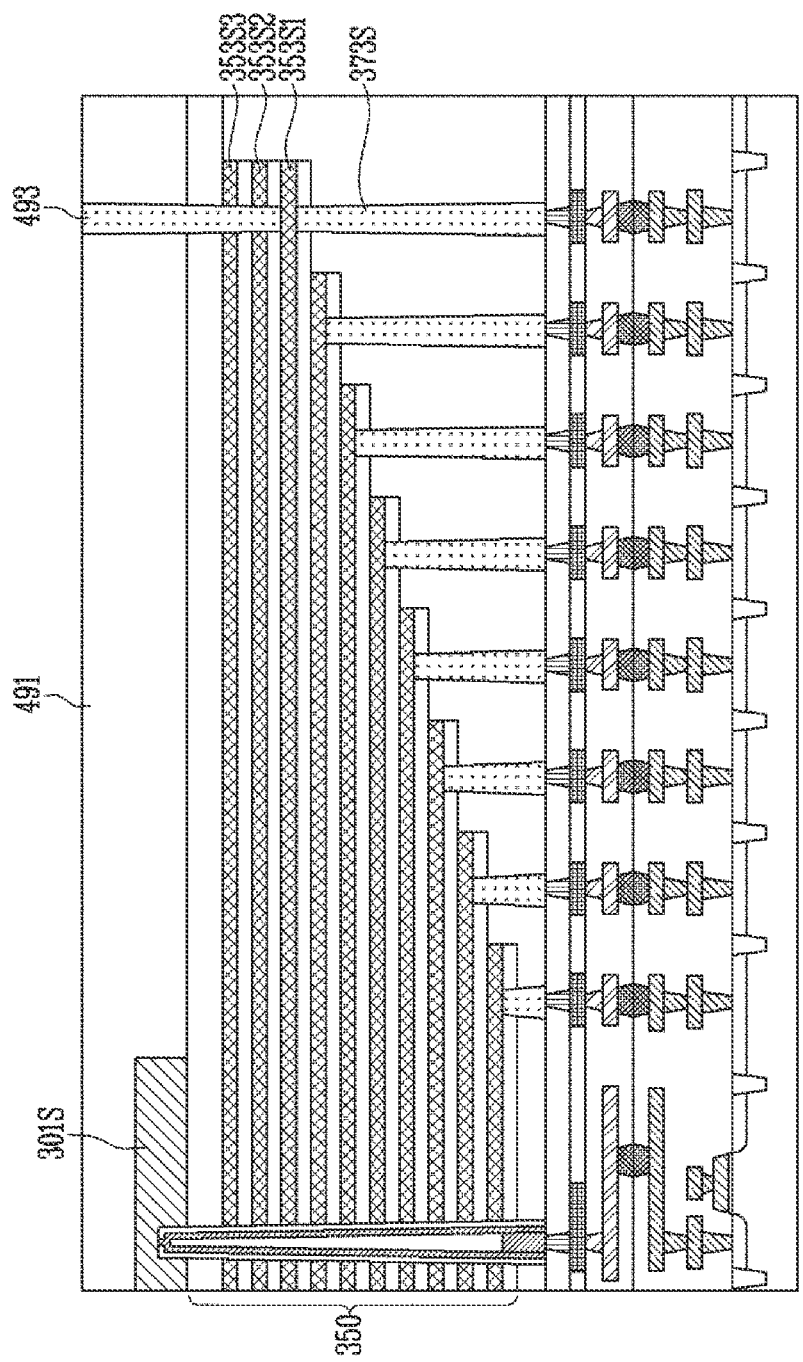

SEMICONDUCTOR MEMORY DEVICE AND METHOD OF MANUFACTURING SEMICONDUCTOR MEMORY DEVICE

CROSS-REFERENCE TO RELATED APPLICATION

The present application claims priority under 35 U.S.C. § 119(a) to Korean patent application number 10-2020-0181055, filed on Dec. 22, 2020, in the Korean Intellectual Property Office, the entire disclosure of which is incorporated herein by reference.

BACKGROUND

1. Technical Field

The present disclosure may relate to a semiconductor memory device and a method of manufacturing the semiconductor memory device, and more particularly, to a three-dimensional semiconductor memory device and a method of manufacturing the three-dimensional semiconductor memory device.

2. Related Art

A semiconductor memory device may include a memory cell array. The memory cell array may include a plurality of memory cells that are capable of storing data. Memory cells of a three-dimensional semiconductor memory device may be arranged in a three dimension.

SUMMARY

According to an embodiment of the present disclosure, a semiconductor memory device may include a word line, a first select line on the word line, a second select line on the first select line, a first upper contact extending to be in contact with a first surface of the first select line, and a second upper contact extending through the second select line to be in contact with a second surface of the first select line, wherein the first surface and the second surface of the first select line are on opposites sides.

According to an embodiment of the present disclosure, a semiconductor memory device may include a peripheral circuit structure, a word line on the peripheral circuit structure, interlayer insulating layers and select lines alternately stacked on the word line, a first upper contact extending from one select line, among the select lines, adjacent to the peripheral circuit structure, toward the peripheral circuit structure, and a second upper contact extending from the one select line in an opposite direction compared to the first upper contact and connecting the select lines to each other.

According to an embodiment of the present disclosure, a semiconductor memory device may include a peripheral circuit structure, a lower select line above the peripheral circuit structure, word lines on the lower select line, upper select lines stacked on the word lines, interlayer insulating layers between the lower select line, the word lines, and the upper select lines, a channel layer passing through the lower select line, the word lines, the upper select lines, and the interlayer insulating layers, a memory layer surrounding a sidewall of the channel layer, a first upper contact extending from one upper select line, among the upper select lines, adjacent to the peripheral circuit structure, toward the peripheral circuit structure, and a second upper contact extending from the one upper select line in an opposite direction compared to the first upper contact, and connecting the upper select lines to each other.

According to an embodiment of the present disclosure, a method of manufacturing a semiconductor memory device may include forming interlayer insulating layers and conductive patterns surrounding a sidewall of a channel layer with a memory layer interposed therebetween, and alternately stacked in a length direction of the channel layer, forming a first upper contact extending in the length direction of the channel layer from one conductive pattern among the conductive patterns, and forming a second upper contact that extends from the one conductive pattern in an opposite direction compared to the first upper contact and connecting two or more conductive patterns among the conductive patterns to each other.

BRIEF DESCRIPTION OF THE DRAWINGS

FIGS. 6, 7A, 7B, 8, 9, 10A, and 10B are diagrams illustrating a process of forming a memory circuit structure according to an embodiment of the present disclosure.

FIGS. 12A, 12B, 12C, and 12D are cross-sectional views for each process step illustrating an embodiment of subsequent processes after the bonding process.

DETAILED DESCRIPTION

Specific structural or functional descriptions disclosed herein are merely illustrative for the purpose of describing embodiments according to the concept of the present disclosure. The embodiments according to the concept of the present disclosure can be implemented in various forms, and should not be construed as being limited to the specific embodiments set forth herein.

In an embodiment of the present disclosure, terms such as first and second may be used to distinguish one component from another component. The components are not limited by the terms.

An embodiment of the present disclosure provides a semiconductor memory device with improved an integration degree and a method of manufacturing the semiconductor memory device.

Figure 1:
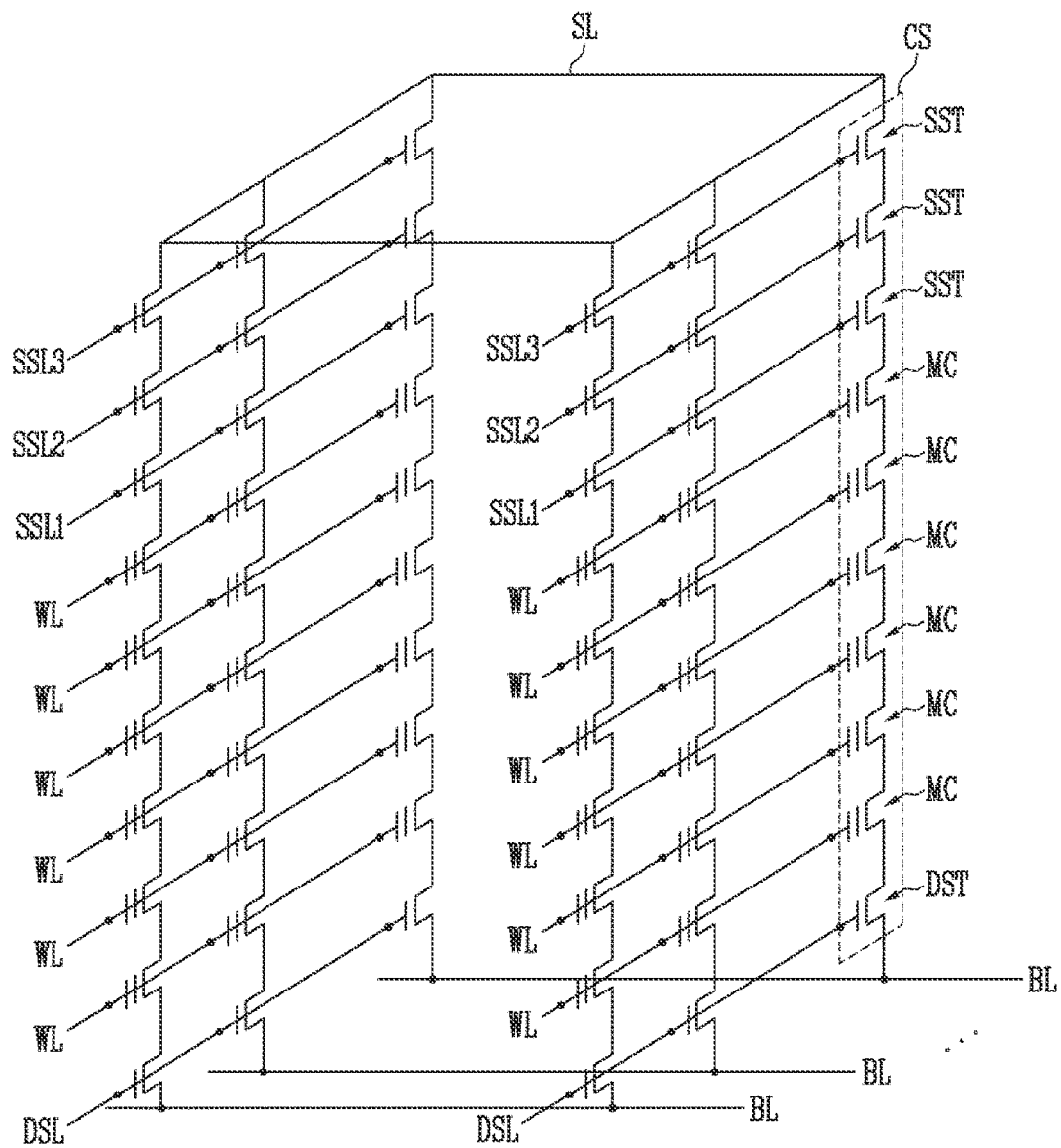
FIG. 1 is a schematic circuit diagram of a semiconductor memory device according to an embodiment of the present disclosure.

FIG. 1 is a schematic circuit diagram of a semiconductor memory device according to an embodiment of the present disclosure.

Referring to FIG. 1, the semiconductor memory device may include a source layer SL, a plurality of bit lines BL, and a plurality of cell strings CS.

The plurality of cell strings CS may be disposed between the source layer SL and the plurality of bit lines BL. The plurality of cell strings CS may be commonly connected to the source layer SL. The cell strings CS may be divided into a plurality of cell string groups. Each of the cell string groups may include two or more cell strings CS. The cell string groups may be connected to the bit lines BL, respectively. For example, a first cell string group may be connected to a first bit line, and a second cell string group may be connected to a second bit line. The two or more cell strings CS in each cell string group may be connected to one bit line BL in parallel. For example, a first cell string and a second cell string of the first cell string group may be connected to the first bit line in parallel, and a third cell string and a fourth cell string of the second cell string group may be connected to the second bit line in parallel.

Each of the cell strings CS may include a drain select transistor DST, a source select transistor SST, and a plurality of memory cells MC. The drain select transistor DST may be connected between the plurality of memory cells MC and the bit line BL. The source select transistor SST may be connected between the plurality of memory cells MC and the source layer SL. The memory cells MC may be connected between the drain select transistor DST and the source select transistor SST, in series.

The bit line BL may be connected to the plurality of memory cells MC via the drain select transistor DST. The source layer SL may be connected to the plurality of memory cells MC via the source select transistor SST. One drain select transistor or two or more drain select transistors that are connected in series may be disposed between the bit line BL and the plurality of memory cells MC. One source select transistor or two or more source select transistors that are connected in series may be disposed between the source layer SL and the plurality of memory cells MC. The two or more source select transistors that are connected in series may reduce a current leakage of the cell string CS by increasing the channel length between the source layer SL and the plurality of memory cells MC.

The cell string CS, shown in FIG. 1, may include one drain select transistor DST that is connected between the bit line BL and the plurality of memory cells MC, and the cell string CS may include three source select transistors SST that are connected between the source layer SL and the plurality of memory cells MC, in series. Hereinafter, a structure of the semiconductor memory device is described based on an embodiment of the cell string CS shown in FIG. 1. However, an embodiment of the present disclosure is not limited thereto.

Each of the cell strings CS may be connected to a drain select line DSL, source select lines SSL1, SSL2, and SSL3, and word lines WL. The drain select line DSL may be used as a gate of the drain select transistor DST, the source select lines SSL1, SSL2, and SSL3 may be used as gates of the source select transistors SST, respectively, and the word lines WL may be used as gates of the memory cells MC, respectively.

The drain select line DSL, the word lines WL, and the source select lines SSL1, SSL2, and SSL3 may be connected to a peripheral circuit structure to receive a driving signal from the peripheral circuit structure. The source select lines SSL1, SSL2, and SSL3 may be connected to each other to receive the same gate signal.

Figure 2:
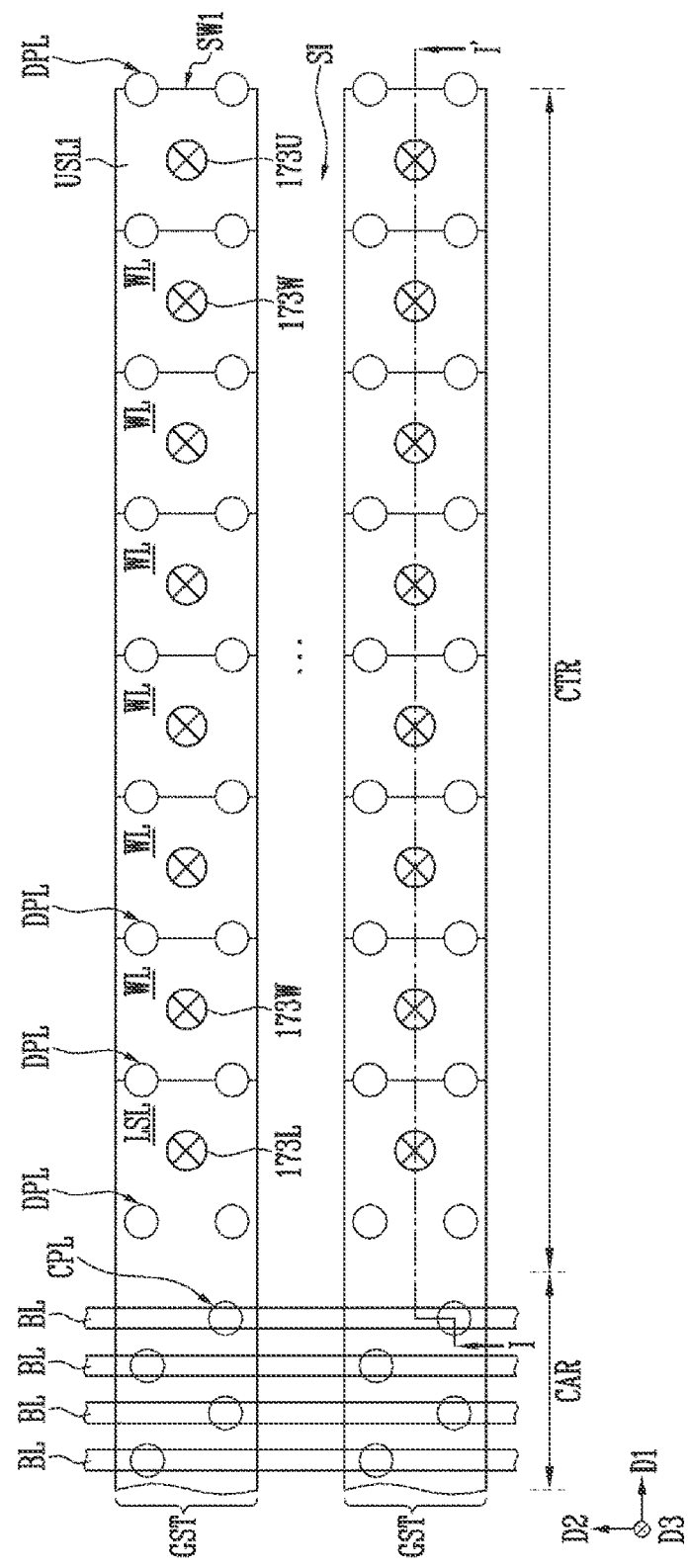
FIG. 2 is a schematic diagram illustrating a semiconductor memory device according to an embodiment of the present disclosure.

FIG. 2 is a schematic diagram illustrating a semiconductor memory device according to an embodiment of the present disclosure. In order to help with understanding the embodiment, some configurations of the semiconductor memory device are shown in FIG. 2. Specifically, FIG. 2 shows a plurality of bit lines BL, cell pillars CPL, gate stacks GST, contacts 173L, 173W, and 173U, and dummy pillars DPL. In addition, FIG. 2 shows conductive patterns LSL, WL, and USL1 of each of the gate stacks GST.

Figure 3:
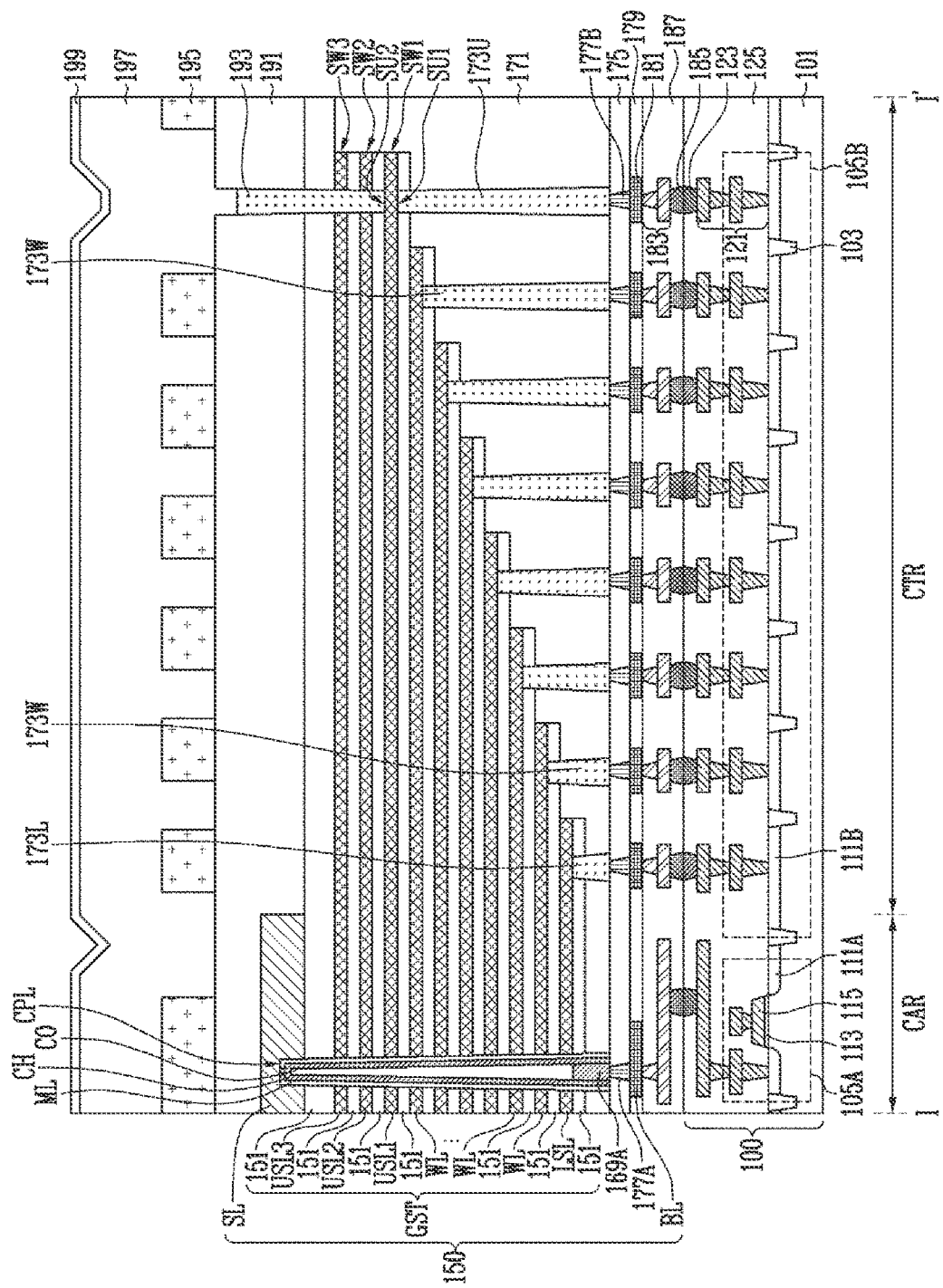
FIG. 3 is a cross-sectional view of the semiconductor memory device taken along a line I-I' shown in FIG. 2.

FIG. 3 is a cross-sectional view of the semiconductor memory device taken along a line I-I' shown in FIG. 2.

Referring to FIGS. 2 and 3, the semiconductor memory device may include a peripheral circuit structure 100, a cell array structure 150, contacts 173L, 173W, 173U, and 193, upper wires 195, and protective layers 197 and 199.

The peripheral circuit structure 100 may include a page buffer structure 105A, a block decoder structure 105B, a lower insulating structure 125, first interconnections 121, and first conductive bonding pads 123.

Each of the page buffer structure 105A and the block decoder structure 105B may include transistors. Each of the transistors may include an impurity region 111A or 111B, a gate insulating layer 113, and a gate electrode 115. The impurity region 111A or 111B may be defined by injecting at least one of an n-type impurity and a p-type impurity into active regions of a substrate 101.

The substrate 101 may extend in a first direction D1 and a second direction D2. The first direction D1 and the second direction D2 may be defined as directions in which axes intersecting each other face. The active regions of the substrate 101 may be partitioned by element isolation layers 103. The substrate 101 may be a semiconductor substrate of silicon, germanium, or the like.

Hereinafter, the impurity region of the page buffer structure 105A is defined as the first impurity region 111A, and the impurity region of the block decoder structure 105B is defined as the second impurity region 111B. Each of the first impurity region 111A and the second impurity region 111B may be used as a junction of the transistor. FIG. 3 shows one of the transistors configuring the page buffer structure 105A and a plurality of second impurity regions 111B of the block decoder structure 105B.

The lower insulating structure 125 may cover the page buffer structure 105A and the block decoder structure 105B. The lower insulating structure 125 may include two or more insulating layers stacked on the substrate 101.

The first interconnections 121 may be disposed inside the lower insulating structure 125. Each of the first interconnections 121 may include conductive patterns of two or more layers connected to each other. The first interconnections 121 may be connected to each of the gate electrode 115, the first impurity region 111A, and the second impurity region 111B.

The first conductive bonding pads 123 may be disposed inside the lower insulating structure 125. The first conductive bonding pads 123 may be connected to the first interconnections 121, respectively. Each of the first conductive bonding pads 123 may include metal. In an embodiment, the first conductive bonding pad 123 may include copper.

The cell array structure 150 may be disposed on the peripheral circuit structure 100. The cell array structure 150 may include the source layer SL, the bit line BL, the gate stacks GST, and the cell pillars CPL.

One of the source layer SL and the bit line BL may be disposed closer to the peripheral circuit structure 100 than the other. In an embodiment, the bit line BL may be disposed closer to the peripheral circuit structure 100 than the source layer SL. Hereinafter, the cell array structure 150 is described based on an embodiment in which the bit line BL is disposed closer to the peripheral circuit structure 100 than the source layer SL. However, an embodiment of the present disclosure is not limited thereto. Although not shown in the drawing, as another embodiment, the source layer may be disposed closer to the peripheral circuit structure 100 than to the bit line. In other words, the position of the source layer SL and the position of the bit line BL illustrated in FIG. 3 may be reversed.

The gate stack GST may be disposed between the bit line BL and the source layer SL. The gate stack GST may include interlayer insulating layers 151 and conductive patterns (LSL, WL, USL1, USL2, and USL3), alternately disposed on the peripheral circuit structure 100.

The gate stack GST may extend in the first direction D1 and the second direction D2. The gate stacks GST that are adjacent to each other may be separated from each other by a slit SI. Each of the gate stacks GST may be spaced apart from the bit line BL in a third direction D3. The third direction D3 may be a direction that is orthogonal to a surface of the gate stack GST extending in the first direction D1 and the second direction D2.

The gate stack GST may include a cell array region CAR and a contact region CTR that extends from the cell array region CAR. The gate stack GST may surround sidewalls of the cell pillars CPL in the cell array region CAR.

The conductive patterns LSL, WL, USL1, USL2, and USL3 of the gate stack GST may include the lower select line LSL, the word lines WL, and the upper select lines USL1, USL2, and USL3 that are stacked in the third direction D3. The word lines WL may be disposed between the upper select lines USL1, USL2, and USL3 and the peripheral circuit structure 100. The word lines WL may be stacked apart from each other in the third direction D3. The lower select line LSL may be disposed between the word lines WL and the peripheral circuit structure 100.

According to the above-described arrangement, the word lines WL may be disposed between the lower select line LSL and the upper select lines USL1, USL2, and USL3. In addition, the upper select lines USL1, USL2, and USL3 may be spaced farther from the peripheral circuit structure 100 than the lower select line LSL and the word lines WL.

The conductive patterns LSL, WL, USL1, USL2, and USL3 may form a stepped structure in the contact region CTR of the gate stack GST. To this end, the upper select lines USL1, USL2, and USL3 may extend farther in the first direction D1 in the contact region CTR than the word lines WL and the lower select line LSL. The word lines WL may extend farther in the first direction D1 in the contact region CTR than the lower select line LSL. The word lines WL that are farther from the lower select line LSL in the third direction D3 may extend farther in the first direction D1 in the contact region CTR than the word lines WL that are closer to the lower select line LSL in the third direction D3. Accordingly, the word lines WL may configure a word line stack of a stepped structure.

Sidewalls SW1, SW2, and SW3 of the upper select lines USL1, USL2, and USL3 that face the first direction D1 may be substantially disposed on the same line.

The upper select lines USL1, USL2, and USL3 may include two or more select lines that are stacked apart from each other in the third direction D3. In an embodiment, the upper select lines may be configured of three select lines. As in the embodiment shown in the drawing, the upper select lines may include the first upper select line USL1, the second upper select line USL2, and the third upper select line USL3 that are stacked apart from each other in the third direction D3.

The cell pillars CPL may be disposed between the source layer SL and the bit line BL. The cell pillars CPL may pass through the gate stack GST. The cell pillars CPL may extend in the third direction D3. The cell pillars CPL that are disposed in a plurality of rows and a plurality of columns may be surrounded by one gate stack GST.

The cell pillars CPL may configure the plurality of columns. The cell pillars CPL of each column may be arranged along an extension direction of the bit line BL. The cell pillars CPL of each column may overlap the bit line BL corresponding thereto. In an embodiment, the cell pillars CPL of one column may overlap one bit line BL. An embodiment of the present disclosure is not limited thereto, and a layout of the cell pillars CPL and the bit line BL may be varied. Although not shown in the drawing, as another embodiment, the cell pillars CPL of two columns may overlap one bit line BL.

Each of the cell pillars CPL may include a channel layer CH, a memory layer ML, a doped semiconductor pattern 169A, and a core insulating layer CO. The channel layer CH and the memory layer ML may pass through the gate stack GST in the cell array region CAR. The channel layer CH and the memory layer ML may extend in the third direction D3. The third direction D3 may be defined as a length direction of the channel layer CH. A core region of the channel layer CH may be filled with the doped semiconductor pattern 169A and the core insulating layer CO. In an embodiment, the doped semiconductor pattern 169A may include n-type doped silicon. The doped semiconductor pattern 169A may fill a portion of the core region of the channel layer CH. The doped semiconductor pattern 169A may be disposed closer to the peripheral circuit structure 100 than the core insulating layer CO. The core insulating layer CO may overlap the doped semiconductor pattern 169A. The core insulating layer CO may fill a remaining portion of the core region of the channel layer CH. The core insulating layer CO may include a surface that faces an opposite direction compared to the direction that faces the doped semiconductor pattern 169A. The channel layer CH may extend along the surface of the core insulating layer CO.

The channel layer CH may include a source side end that faces the source layer SL and a bit line side end that faces the bit line BL. The source side end of the channel layer CH may be connected to the source layer SL. The bit line side end of the channel layer CH may be connected to the bit line BL via the bit line contact 177A.

The bit line BL may extend in a direction that crosses the slit SI. In an embodiment, the slit SI may extend in the first direction D1, and the bit line BL may extend in the second direction D2.

The bit line BL may pass through a third insulating layer 179. The bit line BL may be directly connected to a bit line contact 177A. The bit line contact 177A may pass through a second insulating layer 175. The bit line contact 177A may connect the channel layer CH and the bit line BL to each other.

The lower select line LSL above the bit line BL may be used as the drain select line DSL, shown in FIG. 1. The upper select lines USL1, USL2, and USL3 that are between the word lines WL and the source layer SL may be used as the source select lines SSL1, SSL2, and SSL3 shown in FIG. 1.

The semiconductor memory device may further include insulating layers 171, 175, 179, and 187 that are disposed between the peripheral circuit structure 100 and the gate stack GST. In an embodiment, the semiconductor memory device may include a first insulating layer 171, a second insulating layer 175, a third insulating layer 179, and a fourth insulating layer 187. The first insulating layer 171 may cover the gate stack GST of the stepped structure. The first insulating layer 171 may be penetrated by the cell pillars CPL that extend toward the peripheral circuit structure 100. The second insulating layer 175 may be disposed between the first insulating layer 171 and the peripheral circuit structure 100. The third insulating layer 179 may be disposed between the second insulating layer 175 and the peripheral circuit structure 100. The fourth insulating layer 187 may be disposed between the third insulating layer 179 and the peripheral circuit structure 100.

The contacts 173L, 173W, 173U, and 193 may be connected to the conductive patterns LSL, WL, USL1, USL2, and USL3 in the contact region CTR of the gate stack GST. The contacts 173L, 173W, 173U, and 193 may electrically connect the cell array structure 150 to the peripheral circuit structure 100. The contacts 173L, 173W, 173U, and 193 may be formed of various conductive materials.

The contacts 173L, 173W, 173U, and 193 may include the lower contact 173L, the word contacts 173W, the first upper contact 173U, and the second upper contact 193.

The lower contact 173L may be connected to the lower select line LSL. The lower contact 173L may contact a surface of the lower select line LSL facing the peripheral circuit structure 100 and may extend toward the peripheral circuit structure 100.

The word lines WL may extend farther than the lower select line LSL toward the contact region CAR in a direction (for example, the first direction D1) that crosses the channel layer CH. The word lines WL may extend farther toward the contact region CAR in the direction that crosses the channel layer CH as the distance from the peripheral circuit structure 100 increases. Accordingly, the word lines WL may configure the word line stack of the stepped structure. In addition, each of the word lines WL may have a region that does not overlap the lower select line LSL in the contact region CAR.

The word contacts 173W may be connected to the word lines WL, respectively. Contact surfaces of the word lines WL that contact the word contacts 173W may be provided by the stepped word line stack. The word contacts 173W may extend toward the peripheral circuit structure 100 from contact surfaces of the word lines WL. Each of the contact surfaces of the word lines WL may be a portion of a surface of each of the word lines WL that faces the peripheral circuit structure 100. The contact surfaces of the word lines WL may be defined in a partial region of the word lines WL that do not overlap the lower select line LSL.

The upper select lines USL1, USL2, and USL3 may extend farther than the word lines WL toward the contact region CAR in the direction (for example, the first direction D1) that crosses the channel layer CH. Accordingly, each of the upper select lines USL1, USL2, and USL3 may have regions that do not overlap the word lines WL and the lower select line LSL in the contact region CAR.

The first upper contact 173U may be connected to the first upper select line USL1. The first upper select line USL1 may be closest to the peripheral circuit structure 100 among the upper select lines USL1, USL2, and USL3. The contact surface of the first upper select line USL1 that contacts the first upper contact 173U may be provided by the first upper select line USL1 that extends farther in the first direction D1 than the lower select line LSL and the word lines WL. More specifically, the first upper contact 173U may contact a first surface SU1 of the first upper select line USL1. The first upper contact 173U may extend from the first surface SU1 of the first upper select line USL1 toward the peripheral circuit structure 100. The first surface SU1 of the first upper select line USL1 may be a portion of a surface of the first upper select line USL1 that faces the peripheral circuit structure 100. The first surface SU1 of the first upper select line USL1 may be defined in a partial region of the first upper select line USL1 that does not overlap the lower select line LSL and the word lines WL.

Each of the lower contact 173L, the word contacts 173W, and the first upper contact 173U may pass through the first insulating layer 171. Each of the lower contact 173L, the word contacts 173W, and the first upper contact 173U may pass through at least one of the interlayer insulating layers 151. Each of the lower contact 173L, the word contacts 173W, and the first upper contact 173U may have a tapered shape that becomes thinner as the distance from the substrate 101 increases. The lower contact 173L, the word contacts 173W, and the first upper contact 173U may be connected to the first conductive bonding pads 123 via a plurality of conductive patterns 177B, 181, 183, and 185.

The plurality of conductive patterns 177B, 181, 183, and 185 may include a contact plug 177B, a pad pattern 181, a second interconnection 183, and a second conductive bonding pad 185. The contact plug 177B may be disposed between the first conductive bonding pad 123 and one of the lower contact 173L, the word contacts 173W, and the first upper contact 173U. The contact plug 177B may be connected to one of the lower contact 173L, the word contacts 173W, and the first upper contact 173U. The contact plug 177B may pass through the second insulating layer 175. The pad pattern 181 may be connected to the contact plug 177B. The pad pattern 181 may pass through the third insulating layer 179. The second interconnection 183 may be connected to the contact plug 177B. The second interconnection 183 may be disposed inside of the fourth insulating layer 187. The second conductive bonding pad 185 may be bonded to the first conductive bonding pad 123. The second conductive bonding pad 185 may connect the second interconnection 183 and the first conductive bonding pad 123 to each other.

The second upper contact 193 may electrically connect the upper select lines USL1, USL2, and USL3 to each other. The second upper contact 193 may be connected to the first upper select line USL1. The second upper contact 193 may extend toward an opposite direction compared to the first upper contact 173U. The second upper contact 193 may have a tapered shape inverse to the tapered shape of the first upper contact 173U. More specifically, the second upper contact 193 may have the tapered shape that becomes thinner as the distance from the peripheral circuit structure 100 decreases. In other words, the first upper contact 173U and the second upper contact 193 may have the tapered shape that becomes thinner as the distance from the first upper select line USL1 decreases.

The position of the second upper contact 193 may be determined so that the second upper contact 193 is not connected to the word lines WL due to a punch phenomenon. In an embodiment, the second upper contact 193 may be connected to a portion of the first upper select line USL1 that does not overlap the word lines WL in the contact region CTR. In an embodiment, the second upper contact 193 may be connected to a second surface SU2 of the first upper select line USL1 in the contact region CTR. The second surface SU2 may face an opposite direction compared to the first surface SUL. The second surface SU2 may be defined in a partial region of the first upper select line USL1 that does not overlap the lower select line LSL and the word lines WL.

The second upper contact 193 may pass through the select lines USL2 and USL3 on the first upper select line USL1. In an embodiment, the second upper select line USL2 and the third upper select line USL3 may be stacked on the first upper select line USL1. The second upper contact 193 may pass through the second upper select line USL2 and the third upper select line USL3. Each of the second upper select line USL2 and the third upper select line USL3 may directly contact a sidewall of the second upper contact 193. Accordingly, the first upper select line USL1, the second upper select line USL2, and the third upper select line USL3 may be connected to each other through the second upper contact 193.

According to an embodiment of the present disclosure, the first upper select line USL1, the second upper select line USL2, and the third upper select line USL3 may be connected to each other through the second upper contact 193. Accordingly, a signal that is provided from the block decoder structure 105B of the peripheral circuit structure 100 may be transmitted to the first upper select line USL1, the second upper select line USL2, and the third upper select line USL3 through the first upper contact 173U.

According to an embodiment of the present disclosure, even though upper contacts respectively connected to the upper select lines USL1, USL2, and USL3 that are spaced apart from each other and are stacked are not separately formed, the peripheral circuit structure 100 may be electrically connected to the upper select lines USL1, USL2, and USL3. More specifically, an embodiment of the present disclosure may apply a gate control signal from the peripheral circuit structure 100 to one of the upper select lines USL1, USL2, and USL3 through the first upper contact 173U. In addition, according to an embodiment of the present disclosure, the gate control signal that is applied to the first upper contact 173U may be transmitted to the upper select lines USL1, USL2, and USL3 through the second upper contact 193 that connects the upper select line USL1, USL2, and USL3 to each other.

Although not shown in the drawing, in order to individually connect the upper contacts to the upper select lines, the upper select lines may be formed in a stepped structure. According to an embodiment of the present disclosure, the upper contacts might not be individually connected to upper select lines. Accordingly, in an embodiment of the present disclosure, a stepped structure defined by the upper select lines may be omitted, and the area of the substrate allocated for the stepped structure may be decreased. In addition, an embodiment of the present disclosure may decrease the number of mask processes for forming the upper select lines in a stepped structure.

The semiconductor memory device may further include dummy pillars DPL. The dummy pillars DPL may pass through the gate stack GST in the contact region CTR. The dummy pillars DPL may be spaced apart from the contacts 173L, 173W, 173U, and 193. The dummy pillars DPL may extend in the third direction D3. The dummy pillars DPL may physically support the gate stacks GST. The dummy pillars DPL may be formed of the same material layers as the cell pillars CPL. An arrangement of the dummy pillars DPL may be varied. In an embodiment, the dummy pillars DPL may be disposed to be spaced apart from each of the contacts 173L, 173W, 173U, and 193 in four directions.

The semiconductor memory device may further include an upper insulating layer 191 that covers the cell array structure 150. The second upper contact 193 may pass through the upper insulating layer 191 and may extend toward the first upper select line USL1. An upper surface of the second upper contact 193 may be disposed at a lower level than an upper surface of the upper insulating layer 191.

The upper wires 195 may be disposed on the upper insulating layer 191. The upper wires 195 may be formed of metal such as aluminum.

The protective layers 197 and 199 may cover the upper wires 195. In an embodiment, the protective layers 197 and 199 may include a first protective layer 197 and a second protective layer 199. The first protective layer 197 may be disposed on the upper insulating layer 191. The first protective layer 197 may cover the second upper contact 193. The first protective layer 197 may include a high-density plasma oxide layer. The second protective layer 199 may be disposed on the first protective layer 197. The second protective layer 199 may include a silicon oxynitride layer (SiON).

A process of forming the peripheral circuit structure 100 and a process of forming the cell array structure 150 are not continuous and may be individually performed. Accordingly, since heat that is generated in the process of forming the cell array structure 150 does not affect the peripheral circuit structure 100, a defect of the semiconductor memory device due to heat may be reduced. A method of manufacturing a semiconductor memory device according to an embodiment of the present disclosure is described with reference to the drawing below.

Figure 4:
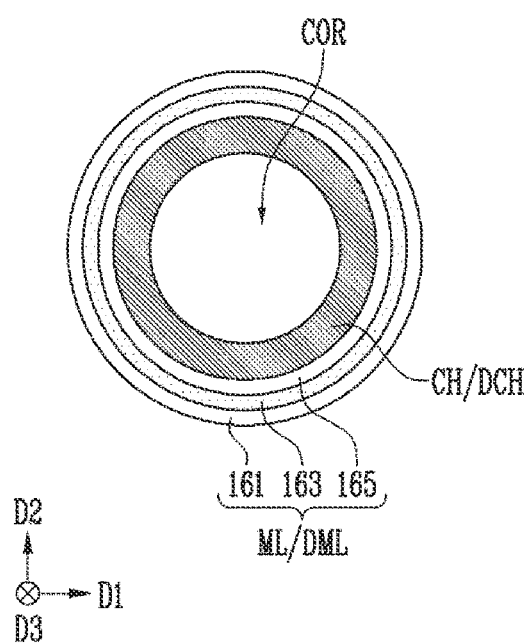
FIG. 4 is a cross-sectional view illustrating a cell pillar and a dummy pillar shown in FIG. 2.

FIG. 4 is a cross-sectional view illustrating the cell pillar and the dummy pillar shown in FIG. 2.

Referring to FIG. 4, the memory layer ML of the cell pillar CP may surround a sidewall of the channel layer CH. The dummy pillar DPL may include a dummy channel layer DCH and a dummy memory layer DML. The dummy memory layer DML may surround a sidewall of the dummy channel layer DCH.

The cell pillar CPL and the dummy pillar DPL may include the same material layers. More specifically, the dummy memory layer DML and the dummy channel layer DCH of the dummy pillar DPL may be associated with materials of the memory layer ML and the channel layer CH of the cell pillar CPL.

Each of the channel layer CH and the dummy channel layer DCH may include a semiconductor material. In an embodiment, the semiconductor material may include silicon. The core region COR may be defined by the channel layer CH or the dummy channel layer DCH. The core region COR may be a region defined by being surrounded by the channel layer CH or the dummy channel layer DCH, and the core region COR may be filled with an insulating material or a doped semiconductor.

Each of the memory layer ML and the dummy memory layer DML may include a blocking insulating layer 161, a data storage layer 163, and a tunnel insulating layer 165. The data storage layer 163 may be disposed between the blocking insulating layer 161 and the tunnel insulating layer 165. The tunnel insulating layer 165 may be disposed between the blocking insulating layer 161 and the channel layer CH or between the blocking insulating layer 161 and the dummy channel layer DCH. The blocking insulating layer 161 may prevent a phenomenon in which an electric charge flows into the conductive patterns LSL, WL, USL1, USL2, and USL3 shown in FIGS. 2 and 3. The data storage layer 163 of the memory layer ML may be used as a data storage region. In an embodiment, the data storage layer 163 may be formed of a material that is capable of storing data that is changed using Fowler Nordheim tunneling. The material may include nitride that is capable of charge trapping. The tunnel insulating layer 165 may include an insulating material that is capable of charge tunneling. In an embodiment, the tunnel insulating layer 165 may include silicon oxide.

Figure 5:
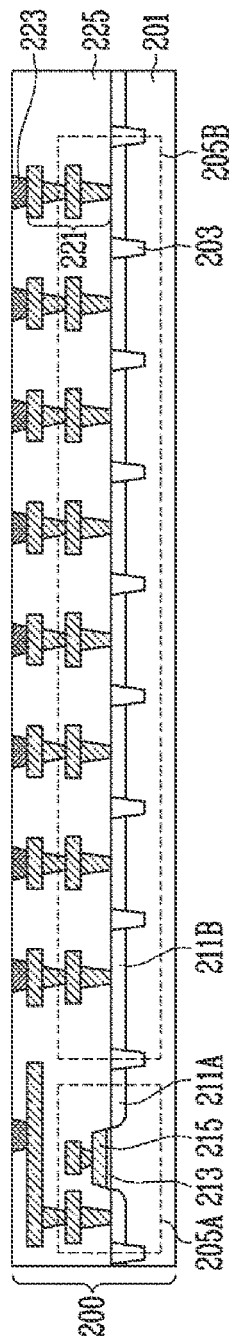
FIG. 5 is a cross-sectional view illustrating a process of forming a peripheral circuit structure according to an embodiment of the present disclosure.

FIG. 5 is a cross-sectional view illustrating a process of forming a peripheral circuit structure according to an embodiment of the present disclosure. Hereinafter, the detailed description of configurations that overlap with FIG. 3 is omitted.

Referring to FIG. 5, the peripheral circuit structure 200 may include a substrate 201 with a page buffer structure 205A and a block decoder structure 205B, a lower insulating structure 225, first interconnections 221, and first bonding pads 223.

The forming of the peripheral circuit structure 200 may involve forming element isolation layers 203 in the semiconductor substrate 201, forming transistors of the page buffer structure 205A and the block decoder structure 205B, and forming the interconnections 221 and forming the first conductive bonding pads 223.

Active regions of the semiconductor substrate 201 may be partitioned by the element isolation layers 203.

Forming the transistors of the page buffer structure 205A and the block decoder structure 205B may include forming a gate insulating layer 213 and a gate electrode 215 on the semiconductor substrate 201 and forming impurity regions 211A and 211B in the active regions in the semiconductor substrate 201. The impurity regions 211A and 211B may be formed by injecting at least one of an n-type impurity and a p-type impurity into the semiconductor substrate 201. The impurity regions 211A and 211B may include first impurity regions 211A of the page buffer structure 205A and second impurity regions 211B of the block decoder structure 205B.

The lower insulating structure 225 may include two or more insulating layers. The first interconnections 221 may be disposed in a portion of the lower insulating structure 225, and the first conductive bonding pads 223 may be disposed in another portion of the lower insulating structure 225.

The first interconnections 221 may be connected to the impurity regions 211A and 211B and the gate electrode 215, respectively. The first interconnections 221 may include conductive patterns of two or more layers that are connected to each other. The first conductive bonding pads 223 may be connected to the first interconnections 222, respectively. The first conductive bonding pads 223 may include a metal, such as copper. The first conductive bonding pads 223 may include surfaces that are not covered by the lower insulating structure 225.

FIGS. 6, 7A, 7B, 8, 9, 10A, and 10B are diagrams illustrating a process of forming a memory circuit structure according to an embodiment of the present disclosure.

Figure 7A:
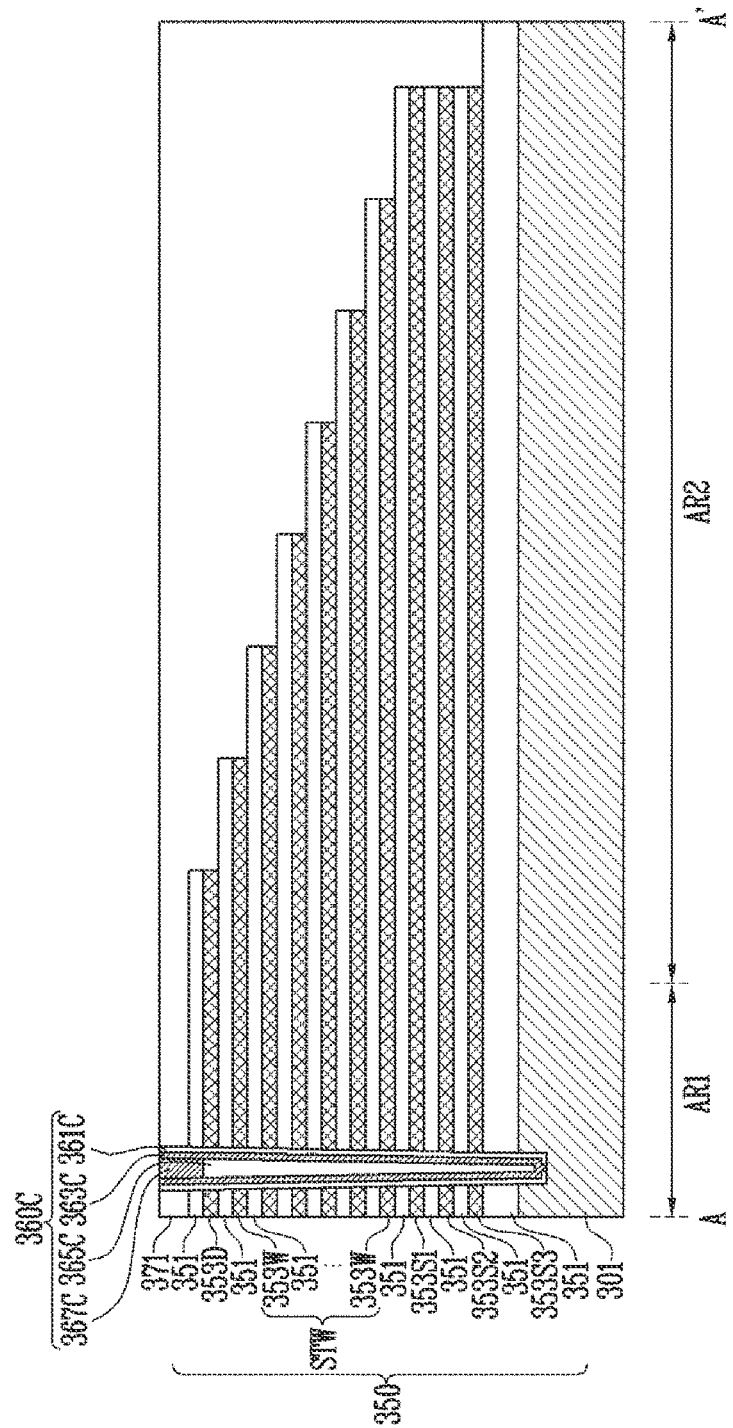
Figure 7B:
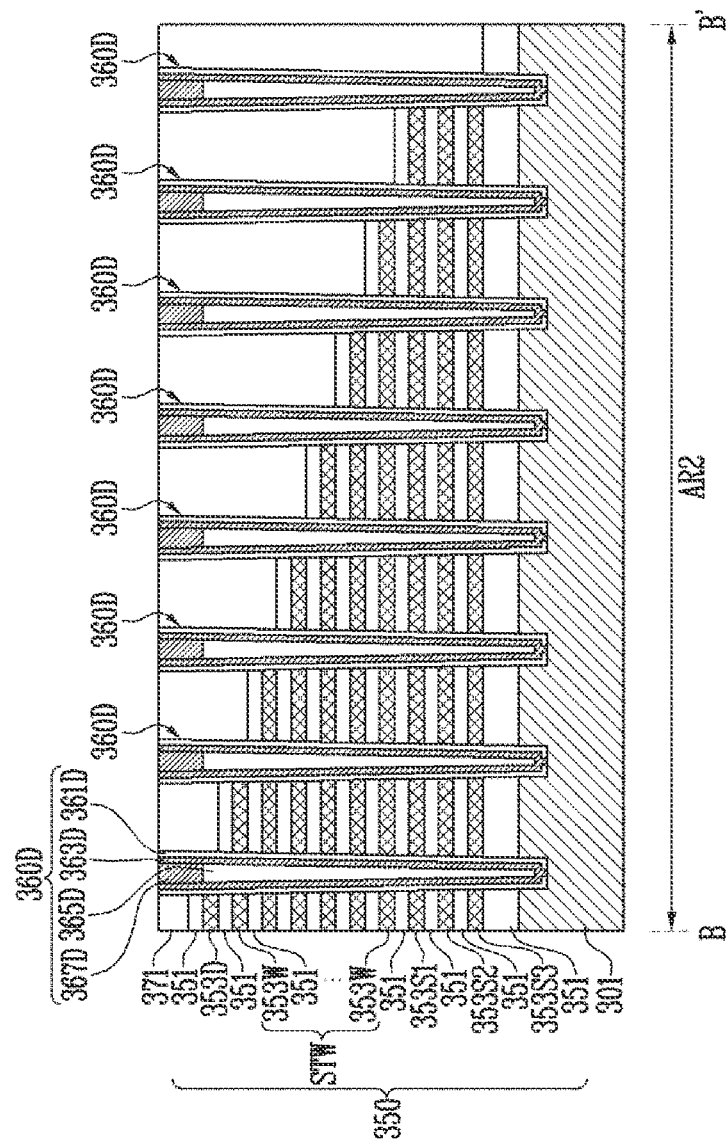

Referring to FIGS. 6, 7A, and 7B, stepped stacks 350 may be formed on a doped semiconductor layer 301. The doped semiconductor layer 301 may include a first region AR1 and a second region AR2 that extends from the first region AR1. Each of the stepped stacks 350 may be penetrated by cell pillars 360C and dummy pillars 360D. The cell pillars 360C and the dummy pillars 360D may overlap the doped semiconductor layer 301.

Each of the cell pillars 360C may include a memory layer 361C and a channel layer 363C. The memory layer 361C may surround a sidewall of the channel layer 363C. The memory layer 361C may be disposed between the stepped stack 350 and the channel layer 363C. The channel layer 363C may be connected to the doped semiconductor layer 301 and may extend to pass through the stepped stack 350. Each of the cell pillars 360C may further include a core insulating layer 365C and a doped semiconductor pattern 367C. The core insulating layer 365C and the doped semiconductor pattern 367C may be disposed in a center region of the cell pillar 360C. The core insulating layer 365C may be disposed between the doped semiconductor pattern 367C and the doped semiconductor layer 301.

The dummy pillars 360D may include a dummy memory layer 361D, a dummy channel layer 363D, a dummy core insulating layer 363D, and a dummy doped semiconductor pattern 367D. The dummy memory layer 361D may be formed of the same material as the memory layer 361C. The dummy channel layer 363D may be formed of the same material as the channel layer 363C. The dummy core insulating layer 365D may be formed of the same material as the core insulating layer 365C. The dummy doped semiconductor pattern 367D may be formed of the same material as the doped semiconductor pattern 367C. The dummy core insulating layer 365D may be disposed between the dummy doped semiconductor pattern 367D and the doped semiconductor layer 301. The dummy channel layer 363D may surround a sidewall of the dummy core insulating layer 365D and may extend onto the sidewall of the dummy doped semiconductor pattern 367D. The dummy memory layer 361D may be disposed between each of the stepped stacks 350 and the dummy channel layer 363D.

Each of the stepped stacks 350 may include interlayer insulating layers 351 and conductive patterns 353S1, 353S2, 353S3, 353W, and 353D, alternately stacked in a length direction of the channel layer 363C. The interlayer insulating layers 351 and the conductive patterns 353S1, 353S2, 353S3, 353W, and 353D may overlap the doped semiconductor layer 301 in the first region AR1 and may extend onto the second region AR2 of the doped semiconductor layer 301.

The conductive patterns 353S1, 353S2, 353S3, 353W, and 353D may include a stack of first side select lines (353S1, 353S2, and 353S3), stepped word line stack STW, and a second side select line 353D. The stack of first side select lines 353S1, 353S2, and 353S3 may be stacked on the doped semiconductor layer 301 in a length direction of the channel layer 363C. The stepped word line stack STW may include word lines 353W stacked on the stack of first side select lines 353S1, 353S2, and 353S3. Because the stepped word line stack STW is formed on the stack of first side select lines 353S1, 353S2, and 353S3 and exposes an end portion of the stack of first side select lines 353S1, 353S2, and 353S3, the end portion of the stack of first side select lines 353S1, 353S2, and 353S3 may be construed as the first step based on the shape that results from the stacking. The second side select line 353D may be disposed on the stepped word line stack STW to form the second step.

The stack of first side select lines 353S1, 353S2, and 353S3 may include a contact region that does not overlap the stepped word line stack STW and the second side select line 353D. To this end, the stack of first side select lines 353S1, 353S2, and 353S3 may extend farther than the stepped word line stack STW and the second side select line 353D in a direction (for example, the first direction D1) that crosses the channel layer 363C.

The stack of first side select lines 353S1, 353S2, and 353S3 may include two or more select lines. In an embodiment, the stack of first side select lines 353S1, 353S2, and 353S3 may include a first select line 353S1 adjacent to the stepped word line stack STW, a second select line 353S2 between the first select line 353S1 and the doped semiconductor layer 301, and a third select line 353S3 between the second select line 353S2 and the doped semiconductor layer 301.

The word lines 353W may include contact regions that do not overlap the second side select line 353D, respectively. To this end, the word lines 353W may extend farther than the second side select line 353D in the direction that crosses the channel layer 363C. The word lines 353W may extend farther in the direction that crosses the channel layer 363C as the distance from the doped semiconductor layer 301 decreases. Accordingly, the stepped word line stack STW may be defined.

One of the stack of first side select lines 353S1, 353S2 and 353S3 and the second side select line 353D may be provided as a source select line, and remaining one of the stack of first side select lines 353S1, 353S2 and 353S3 and the second side select line 353D may be provided as a drain select line. In an embodiment, the stack of first side select lines 353S1, 353S2 and 353S3 may be provided as the source select lines SSL1, SSL2, SSL3 shown in FIG. 1, and the second side select line 353D may be provided as the drain select line DSL shown in FIG. 1. Hereinafter, a manufacturing method according to an embodiment of the present disclosure is described based on an embodiment in which the stack of first side select lines 353S1, 353S2 and 353S3 are provided as the source select lines and the second side select line 353D is provided as the drain select line. However, an embodiment of the present disclosure is not limited thereto.

FIG. 6 shows a planar disposition of the stepped stacks 350, the cell pillars 360C, and the dummy pillars 360D. In FIG. 6, the interlayer insulating layers 351 of each of the stepped stacks 350 are omitted.

Referring to FIG. 6, the stepped stacks 350 may be spaced apart from each other by a slit 370 between the stepped stacks 350. The cell pillars 360C may overlap the first region AR1, and the dummy pillars 360D may overlap the second region AR2. Each of the conductive patterns 353S1, 353S2, 353S3, 353W, and 353D may surround the cell pillars 360C.

FIG. 7A shows a cross section of the doped semiconductor layer 301, a cross section of the stepped stack 350, and a cross section of the cell pillar 360C taken along a line A-A' shown in FIG. 6. FIG. 7B shows a cross section of the doped semiconductor layer 301, a cross section of the stepped stack 350, and a cross section of the dummy pillars 360D, taken along a line B-B', shown in FIG. 6.

Referring to FIGS. 7A and 7B, the cell pillar 360C may overlap the doped semiconductor layer 301 in the first region AR1. The dummy pillars 360D may overlap the doped semiconductor layer 301 in the second region AR2.

The doped semiconductor layer 301 may include doped silicon doped with an n-type impurity.

Each of the memory layer 361C and the dummy memory layer 361D may include the blocking insulating layer 161, the data storage layer 163, and the tunnel insulating layer 165 shown in FIG. 4. Each of the channel layer 363C and the dummy channel layer 363D may include a semiconductor material. In an embodiment, each of the channel layer 363C and the dummy channel layer 363D may include silicon. In an embodiment, each of the doped semiconductor pattern 367C and the dummy doped semiconductor pattern 367D may include doped silicon that is doped with an n-type impurity.

The dummy pillars 360D may support the stepped stack 350 on the second region AR2.

The stepped stack 350 may be covered with the first insulating layer 371. A surface of the first insulating layer 371 may be planarized through a planarization process. The cell pillars 360C and the dummy pillars 360D may extend to pass through the first insulating layer 371.

Figure 8:
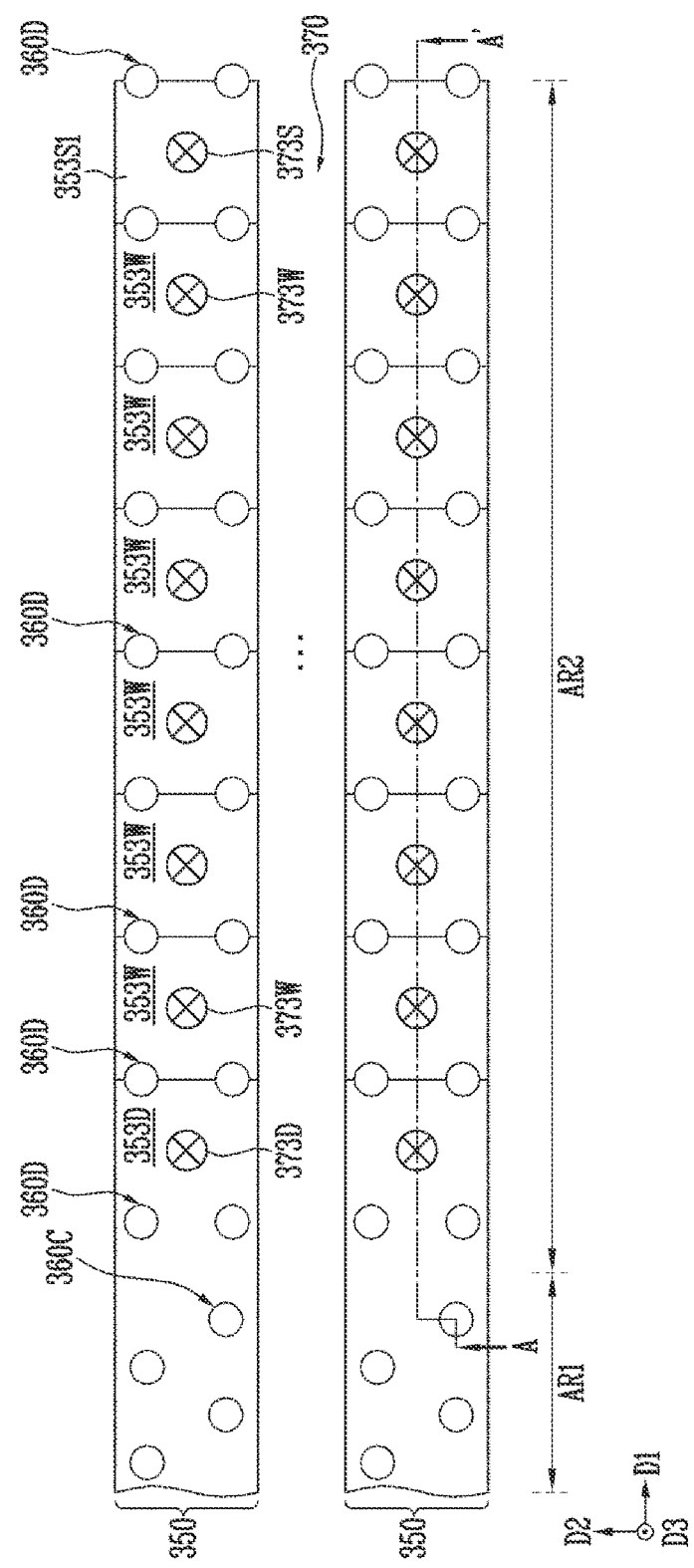
Figure 9:
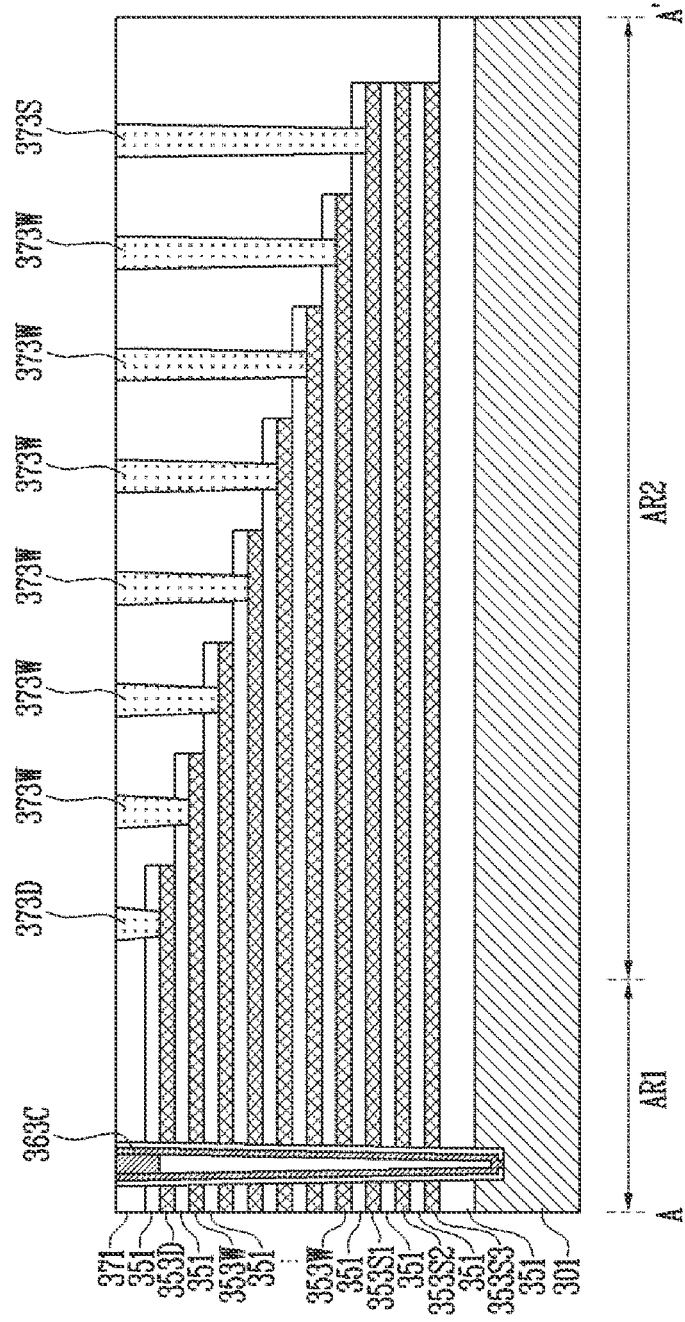

FIGS. 8 and 9 are diagrams illustrating a process of forming the contacts 373D, 373W, and 373S. FIG. 8 shows a planar disposition of the stepped stacks 350, the cell pillars 360C, the dummy pillars 360D, and the contacts 373D, 373W, and 373S. In FIG. 8, the interlayer insulating layers 351 of each of the stepped stacks 350 are omitted. FIG. 9 shows a cross section of the doped semiconductor layer 301, a cross section of the stepped stack 350, a cross section of the cell pillar 360C, and cross sections of each of the contacts 373D, 373W, and 373S taken along a line A-A' shown in FIG. 8.

Referring to FIGS. 8 and 9, the contacts 373D, 373W, and 373S may be formed to pass through the first insulating layer 371 and the interlayer insulating layers 351. The contacts 373D, 373W, and 373S may extend at different lengths in a length direction of the channel layer 363C. The contacts 373D, 373W, and 373S may be formed of various conductive materials.

The contacts 373D, 373W, and 373S may be disposed on the doped semiconductor layer 301 in the second region AR2. The contacts 373D, 373W, and 373S may contact contact regions of the second side select line 353D, the word lines 353W, and the first select line 353S1, respectively.

Contact holes may be formed by etching the first insulating layer 371 and the interlayer insulating layers 351 from the surface of the first insulating layer 371. The contact holes may be formed to expose each of the second side select line 353D, the word lines 353W, and the first select line 353S1. Due to the characteristic of the etching process that proceeds from the surface of the first insulating layer 371 toward the interlayer insulating layer 351, the contact holes may have a tapered shape that becomes thinner as the distance from the second side select line 353D, the word lines 353W, and the first select line 353S1 decreases. The contacts 373D, 373W, and 373S may be formed in the contact holes, respectively. According to the shape of the contact holes, the contacts 373D, 373W, and 373S may have a tapered shape that becomes thinner as the distance from the second side select line 353D, the word lines 353W, and the first select line 353S1 decreases.

The contacts may include a select contact 373D, word contacts 373W, and a first upper contact 373S. The select contact 373D may be connected to the second side select line 353D. The word contacts 373W may be connected to the word lines 353W, respectively, and may extend farther than the select contact 373D. The first upper contact 373S may be connected to the first select line 353S1 and may extend farther than the word contacts 373W.

Figure 10A:
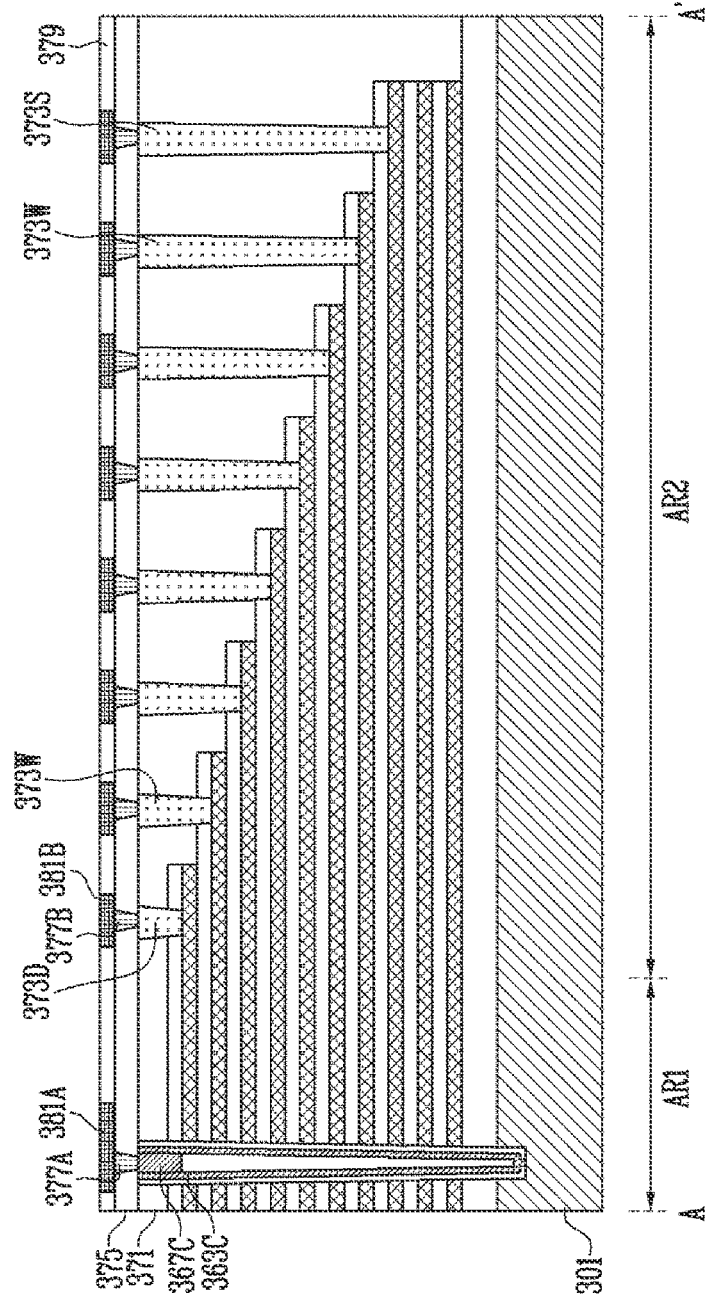
Figure 10B:
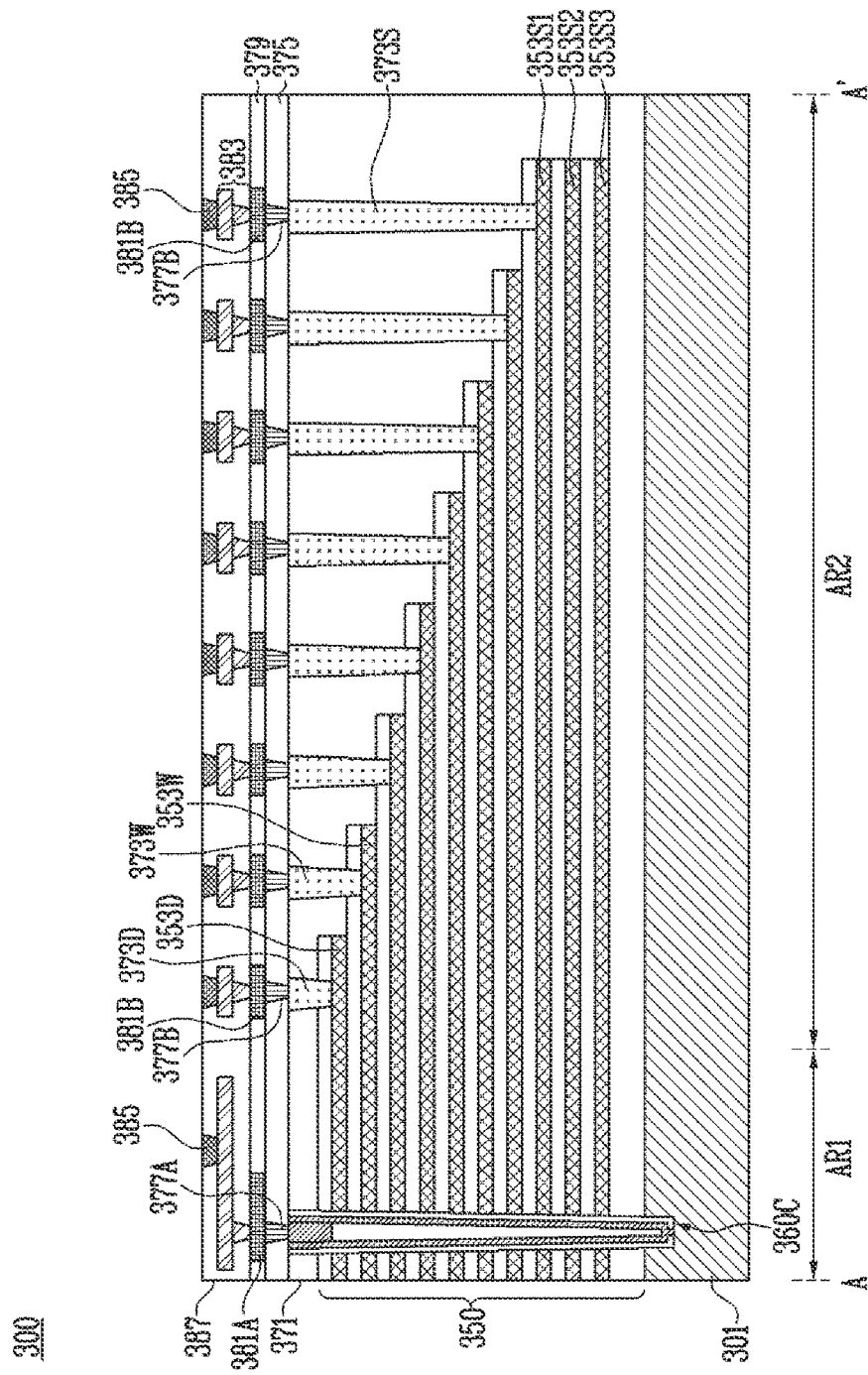

FIGS. 10A and 10B illustrate an embodiment of subsequent processes after forming the contacts 373D, 373W, and 373S.

Referring to FIG. 10A, a second insulating layer 375 may be formed on the first insulating layer 371. The second insulating layer 375 may cover the contacts 373D, 373W, and 373S.

Subsequently, a bit line contact 377A and contact plugs 377B may be formed to pass through the second insulating layer 375. The bit line contact 377A and the contact plugs 377B may be formed through a single mask process. The bit line contact 377A and the contact plugs 377B may be formed of the same conductive material. The bit line contact 377A may be connected to the channel layer 363C via the doped semiconductor pattern 367C. The contact plugs 377B may be connected to the contacts 373D, 373W, and 373S, respectively.

Thereafter, a third insulating layer 379 may be formed on the second insulating layer 375. The third insulating layer 379 may cover the bit line contact 377A and the contact plugs 377B.

Subsequently, a bit line 381A and pad patterns 381B may be formed to pass through the third insulating layer 379. The bit line 381A and the pad patterns 381B may be formed through a single mask process. The bit line 381A and the pad patterns 381B may be formed of the same conductive material. The bit line 381A may be connected to the bit line contact 377A. The pad patterns 381B may be connected to the contact plugs 377B, respectively.

Referring to FIG. 10B, second interconnections 383 and second conductive bonding patterns 385 may be formed on the third insulating layer 379. The second interconnections 383 and the second conductive bonding patterns 385 may be disposed inside a fourth insulating layer 387. The fourth insulating layer 387 may be disposed on the third insulating layer 379.

The second interconnections 383 may be connected to the bit line 381A and the pad patterns 381B, respectively. The second interconnections 383 may include conductive patterns of various structures.

The second conductive bonding patterns 385 may be connected to the second interconnections 383, respectively. The second conductive bonding patterns 385 may include a metal, such as copper. The second conductive bonding patterns 385 may include surfaces that are not covered by the fourth insulating layer 387.

The memory circuit structure 300, shown in FIG. 10B, may be provided through the processes that are described above with reference to FIGS. 6, 7A, 7B, 8, 9, 10A, and 10B.

Figure 11:
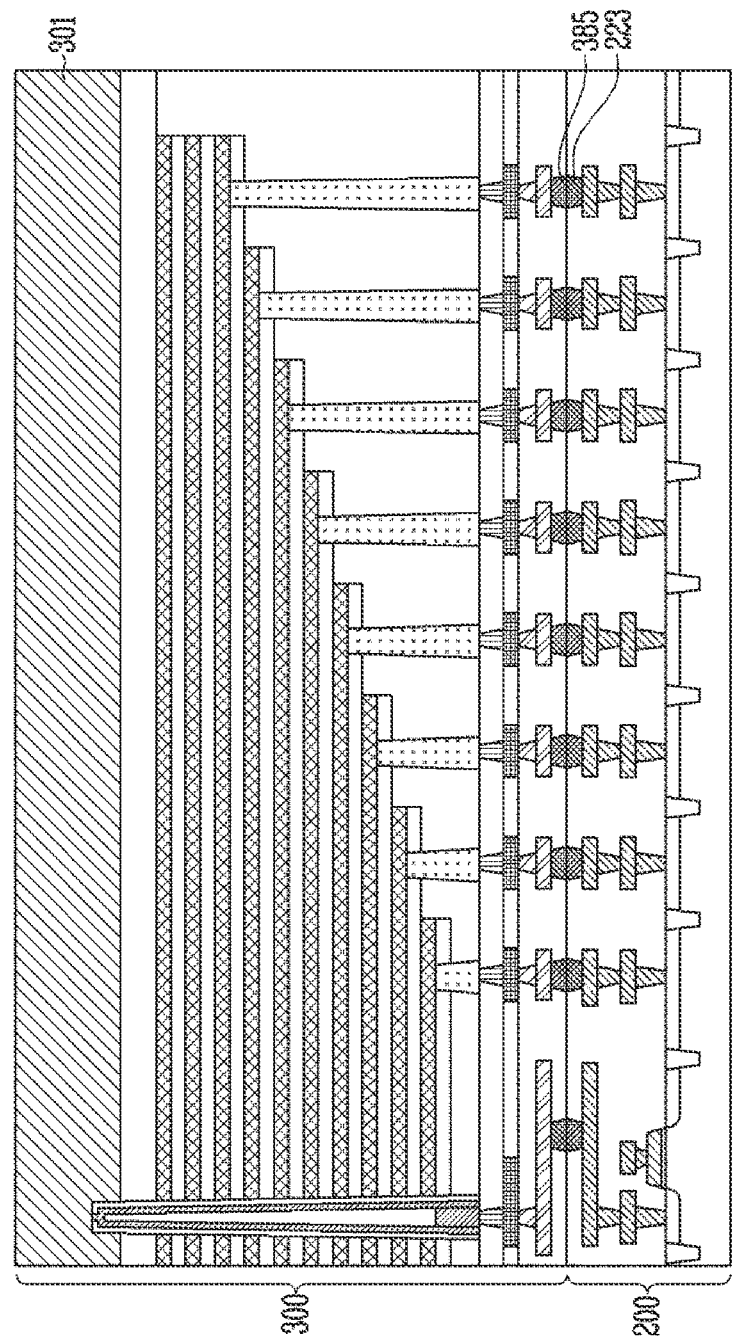
FIG. 11 is a cross-sectional view illustrating a bonding process according to an embodiment of the present disclosure.

FIG. 11 is a cross-sectional view illustrating a bonding process according to an embodiment of the present disclosure.

Referring to FIG. 11, the peripheral circuit structure 200 may be provided by the processes described with reference to FIG. 5. The memory circuit structure 300 may be provided by the processes described with reference to FIGS. 6, 7A, 7B, 8, 9, 10A, and 10B.

The bonding process may be performed so that the peripheral circuit structure 200 and the memory circuit structure 300 are connected to each other. In an embodiment, the bonding process may include bonding the second conductive bonding patterns 385 of the memory circuit structure 300 to the first conductive bonding patterns 223 of the peripheral circuit structure 200.

FIGS. 12A, 12B, 12C, and 12D are cross-sectional views for each process step illustrating an embodiment of subsequent processes after the bonding process.

Figure 12A:
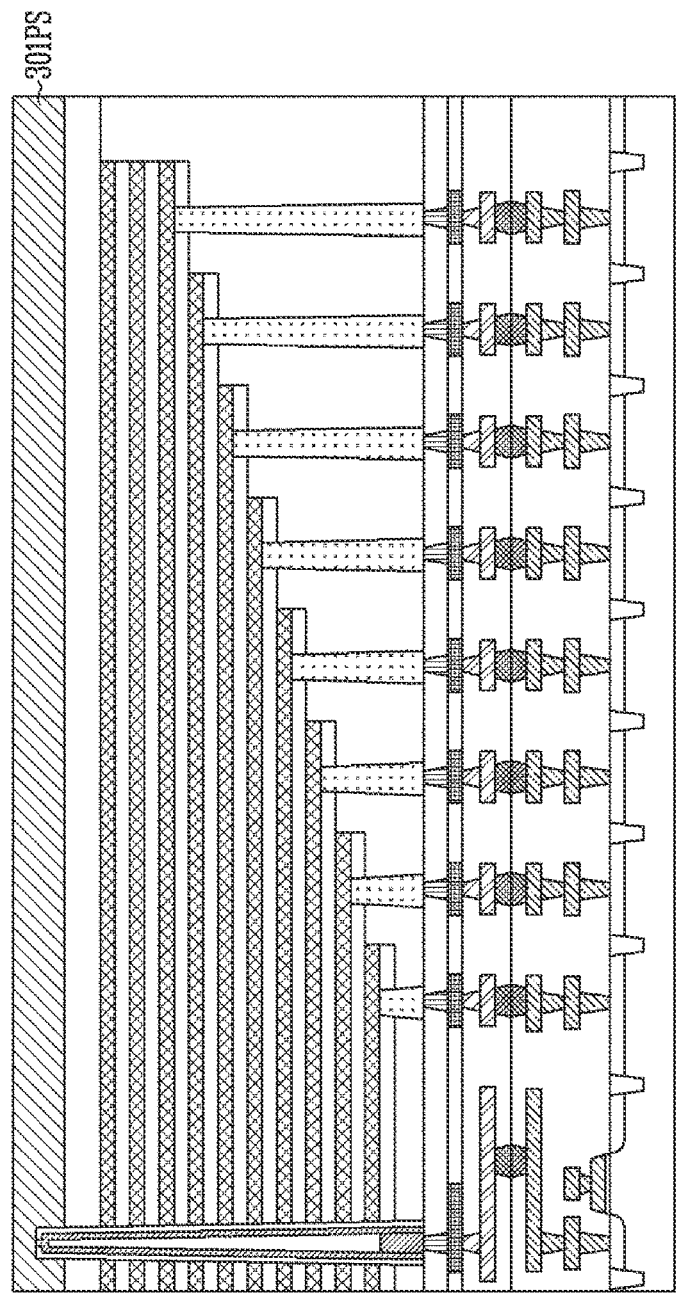

Referring to FIG. 12A, a portion of the doped semiconductor layer 301 that is shown in FIG. 11 may be removed. Accordingly, a preliminary source layer 301PS with a reduced thickness compared to the doped semiconductor layer 301, shown in FIG. 11, may be defined.

Figure 12B:
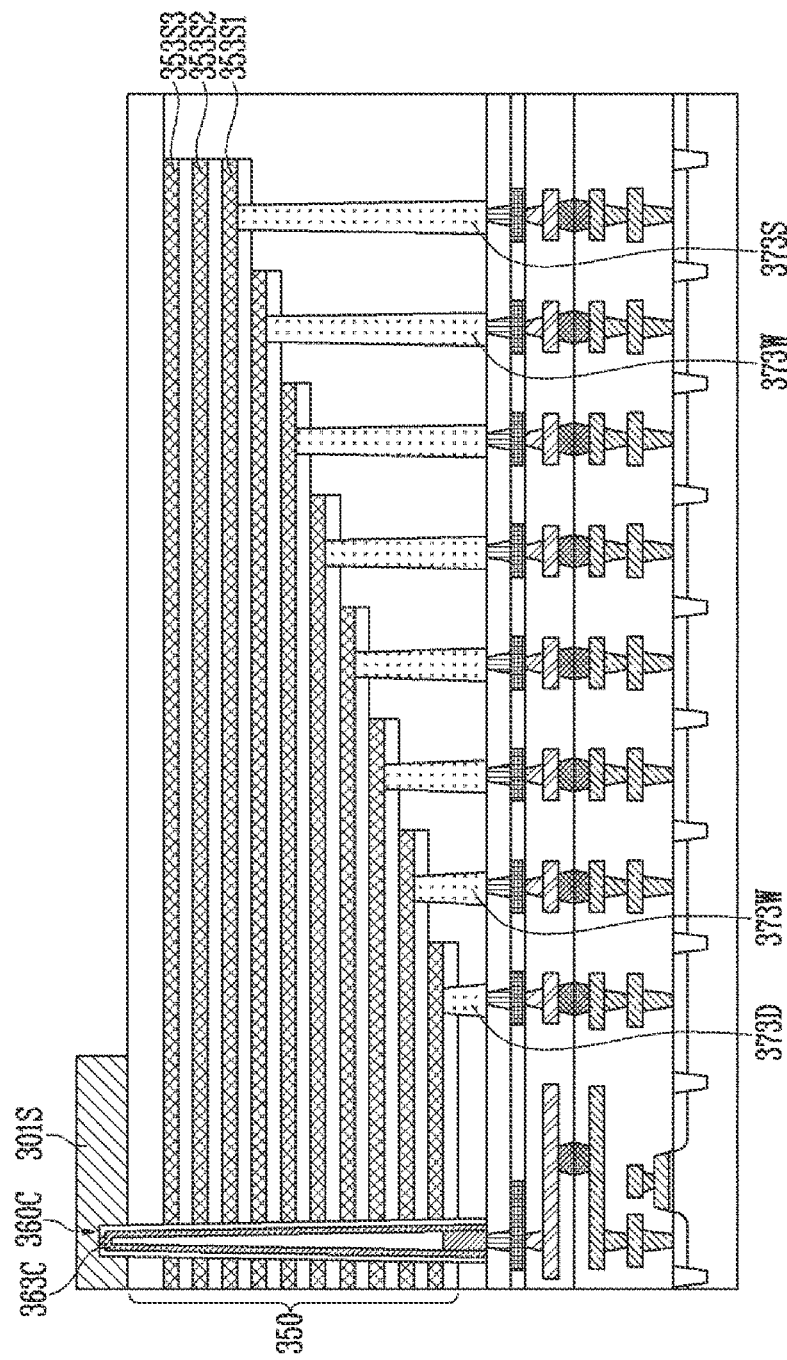

Referring to FIG. 12B, a source layer 301S may be defined by removing a portion of the preliminary source layer 301PS shown in FIG. 12A. As the portion of the preliminary source layer 301PS is removed, a portion of the stepped stack 350 may be exposed. An exposed surface of the stepped stack 350 may face an opposite direction compared to the direction in which the first upper contact 373S faces.

The source layer 301S may overlap the channel layer 363C of the cell pillar 360C. The contact region of the stack of first side select lines 353S1, 353S2, and 353S3 might not overlap with the source layer 301S. In an embodiment, the source layer 301S may remain so as not to overlap the first upper contact 373S.

Referring to FIG. 12C, an upper insulating layer 491 may be formed on the source layer 301S. The upper insulating layer 491 may cover the stepped stack 350.

Subsequently, a second upper contact 493 may be formed. The stack of first side select lines 353S1, 353S2, and 353S3 may be connected to each other through the second upper contact 493. A contact hole that passes through a portion of the upper insulating layer 491 and the stepped stack 350 may be defined through an etching process. The contact hole may be defined by etching a portion of the upper insulating layer 491 and the stepped stack 350 from a surface of the upper insulating layer 491 toward the first select line 353S1. The contact hole may be formed to expose the contact region of the first select line 353S1. The second upper contact 493 may be formed inside the contact hole.

The second upper contact 493 may have a tapered shape, mirroring the first upper contact 373S. In an embodiment, the second upper contact 493 may have the tapered shape that becomes thinner as the distance from the first select line 353S1 decreases.

The second upper contact 493 may pass through the second select line 353S2 and the third select line 353S3 that are adjacent to a surface of the stepped stack 350. The second upper contact 493 may be connected to the contact region of the first select line 353S1. The second upper contact 493 and the first upper contact 373S may extend in opposite directions from the first select line 353S1.

Figure 12D:
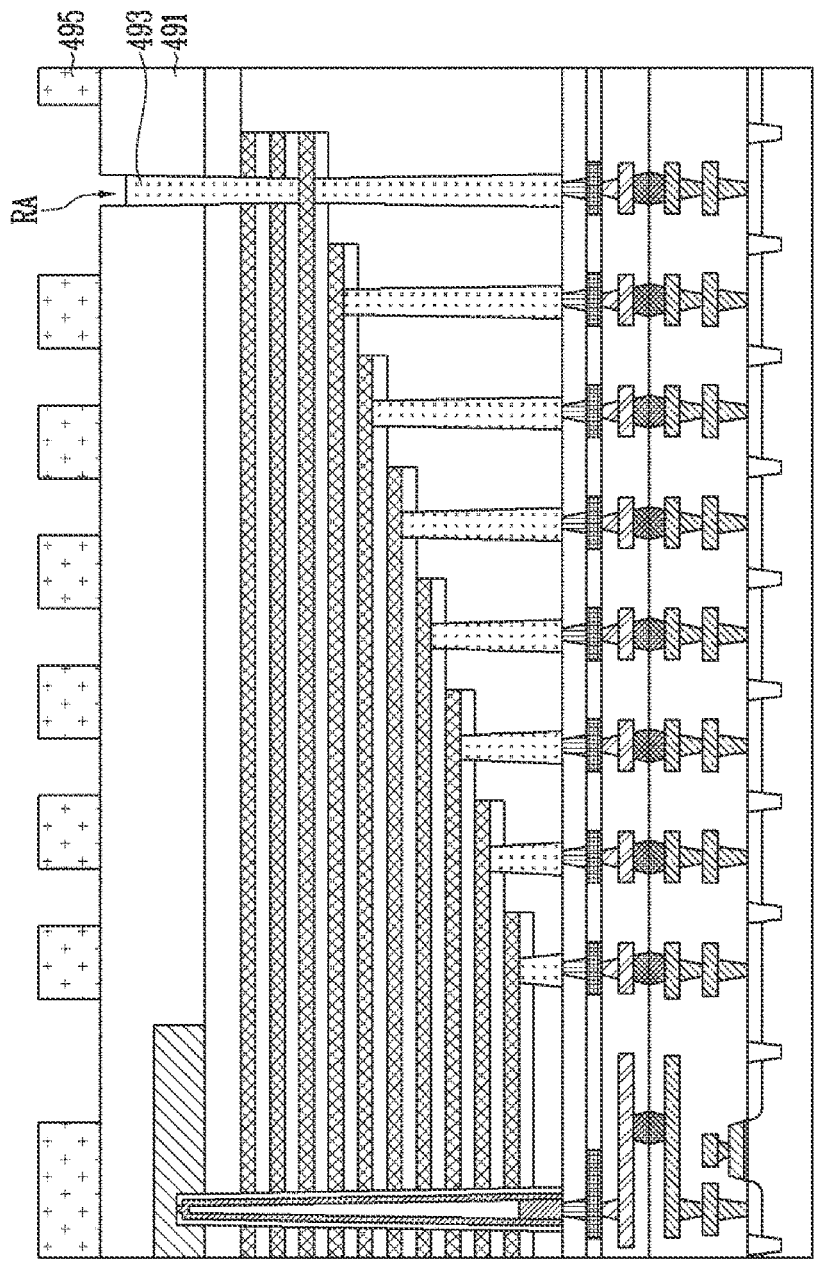

Referring to FIG. 12D, upper wires 495 may be formed on the upper insulating layer 491. Forming the upper wires 495 may involve forming a metal layer, such as aluminum on the upper insulating layer 491, and forming the upper wires 495 that are spaced apart from each other by etching the metal layer.

The second upper contact 493 may be opened between the upper wires 495. A portion of the second upper contact 493 may be etched while etching the metal layer. Accordingly, a recess region RA may be defined on the second upper contact 493. Thereafter, a subsequent process, such as forming a protective layer that fills the recess region RA and covers the upper wires 495, may be performed.

According to the present disclosure, an integration degree may be improved by reducing the area of a select line that is allocated for contacts disposition.

Figure 13:
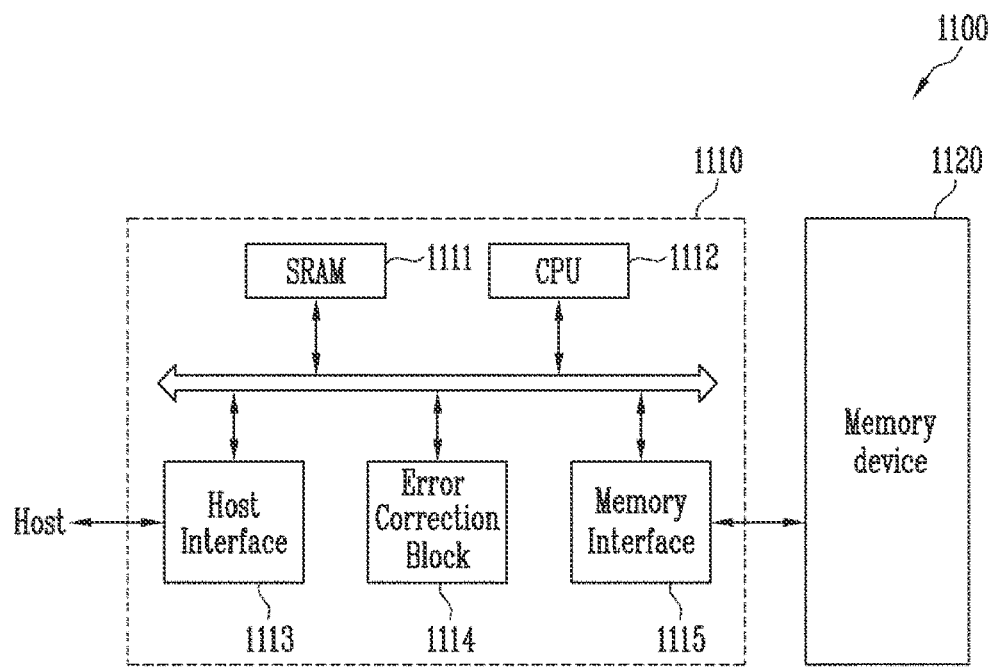
FIG. 13 is a block diagram illustrating a configuration of a memory system according to an embodiment of the present disclosure.

FIG. 13 is a block diagram illustrating a configuration of a memory system according to an embodiment of the present disclosure.

Referring to FIG. 13, the memory system 1100 includes a memory device 1120 and a memory controller 1110.

The memory device 1120 may be a multi-chip package configured of a plurality of flash memory chips. The memory device 1120 may include select lines disposed on different layers, and a first upper contact and a second upper contact extending from one of the select lines in directions opposite to each other. The second upper contact may connect select lines disposed on different layers to each other.

The memory controller 1110 may be configured to control the memory device 1120, and may include a static random access memory (SRAM) 1111, a central processing unit (CPU) 1112, a host interface 1113, an error correction block 1114, and a memory interface 1115. The SRAM 1111 is used as an operation memory of the CPU 1112, the CPU 1112 performs an overall control operation for data exchange of the memory controller 1110, and the host interface 1113 include a data exchange protocol of a host connected to the memory system 1100. The error correction block 1114 detects an error included in data read from the memory device 1120 and corrects the detected error. The memory interface 1115 performs interfacing with the memory device 1120. The memory controller 1110 may further include a read only memory (ROM) that stores code data for interfacing with the host.

The above-described memory system 1100 may be a memory card or a solid state drive (SSD) in which the memory device 1120 and the memory controller 1110 are combined. For example, when the memory system 1100 is the SSD, the memory controller 1110 may communicate with the outside (for example, the host) through one of various interface protocols such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and integrated drive electronics (IDE).

Figure 14:
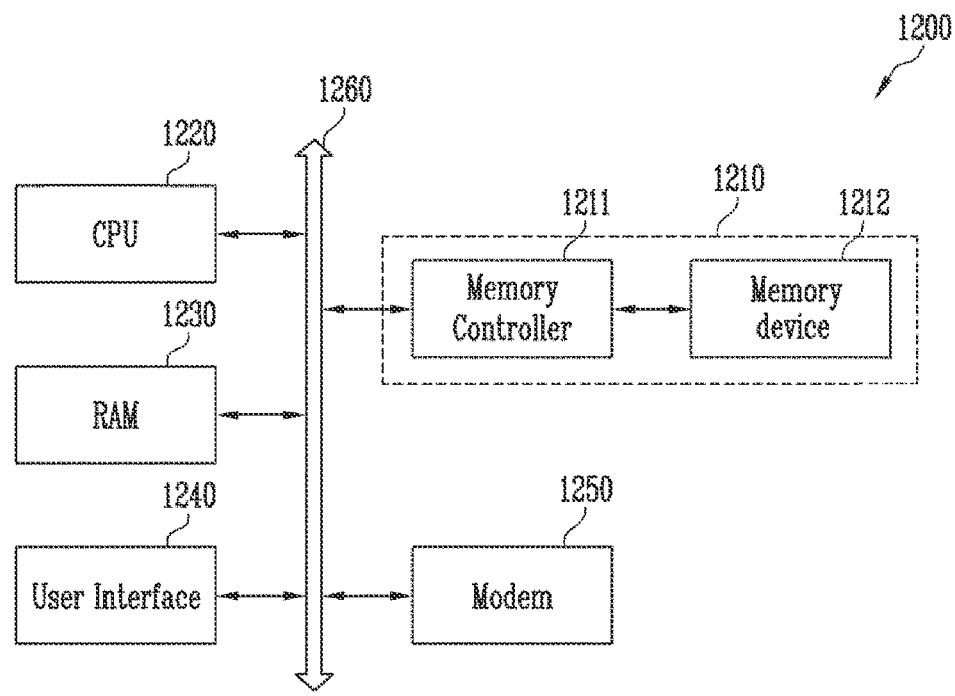
FIG. 14 is a block diagram illustrating a configuration of a computing system according to an embodiment of the present disclosure.

FIG. 14 is a block diagram illustrating a configuration of a computing system according to an embodiment of the present disclosure.

Referring to FIG. 14, the computing system 1200 may include a CPU 1220, a random access memory (RAM) 1230, a user interface 1240, a modem 1250, and a memory system 1210 electrically connected to a system bus 1260. When the computing system 1200 is a mobile device, a battery for supplying an operation voltage to the computing system 1200 may be further included, and an application chipset, an image processor, a mobile DRAM, and the like may be further included.

The memory system 1210 may include a memory device 1212 and a memory controller 1211.

The memory device 1212 may include select lines disposed on different layers, and a first upper contact and a second upper contact extending from one of the select lines in directions opposite to each other. The second upper contact may connect select lines disposed on different layers to each other.

The memory controller 1211 may be configured identically to the memory controller 1110 described above with reference to FIG. 13.

What is claimed is:

1. A semiconductor memory device comprising:
a word line;
a first select line on the word line;
a second select line on the first select line;
a first upper contact extending to be in direct contact with a first lower surface of the first select line; and
a second upper contact extending through the second select line to be in direct contact with an upper surface of the first select line.

2. The semiconductor memory device of claim 1, further comprising:
a substrate,
wherein the word line is disposed between the first select line and the substrate, and
wherein the first select line is disposed between the second select line and the word line.

3. The semiconductor memory device of claim 2, wherein the word line extends in a first direction, and
wherein the first select line and the second select line extend farther in the first direction than the word line.

4. The semiconductor memory device of claim 3, wherein each of the lower surface and the upper surface of the first select line is defined in a portion of the first select line that does not overlap the word line.

5. The semiconductor memory device of claim 2, wherein the first select line and the second select line extend in a first direction so that a sidewall of the first select line and a sidewall of the second select line, each facing the first direction, are substantially disposed on the same line.

6. The semiconductor memory device of claim 2, wherein the first upper contact has a tapered shape that becomes thinner as a distance from the substrate increases.

7. The semiconductor memory device of claim 2, wherein the second upper contact has a tapered shape that becomes thinner as a distance from the substrate decreases.

8. The semiconductor memory device of claim 2, further comprising:
a plurality of conductive patterns disposed between the substrate and the first upper contact; and
an impurity region connected to the plurality of conductive patterns and defined in the substrate.

9. The semiconductor memory device of claim 1, wherein the first upper contact and the second upper contact have a tapered shape that becomes thinner as a distance from the first select line decreases.

10. A semiconductor memory device comprising:
a peripheral circuit structure;
a word line on the peripheral circuit structure;
interlayer insulating layers and select lines alternately stacked on the word line;
a first upper contact directly contacting a lower surface of one select line, extending downward from the lower surface of the one select line, among the select lines, adjacent to the peripheral circuit structure; and
a second upper contact directly contacting an upper surface of the one select line, extending upward from the upper surface of the one select line and connecting the select lines to each other.

11. The semiconductor memory device of claim 10, further comprising:
a channel layer passing through the word line, the interlayer insulating layers, and the select lines; and
a memory layer surrounding a sidewall of the channel layer.

12. The semiconductor memory device of claim 11, wherein the select lines extend farther than the word line in a direction that crosses the channel layer.

13. The semiconductor memory device of claim 12, wherein the first upper contact does not overlap the word line.

14. The semiconductor memory device of claim 12, wherein the second upper contact does not overlap the word line.

15. The semiconductor memory device of claim 10, wherein sidewalls of the select lines are substantially disposed on the same line.

16. The semiconductor memory device of claim 10, wherein the first upper contact has a tapered shape that becomes thinner as a distance from the peripheral circuit structure increases.

17. The semiconductor memory device of claim 10, wherein the second upper contact has a tapered shape that becomes thinner as a distance from the peripheral circuit structure decreases.

18. The semiconductor memory device of claim 10, wherein the peripheral circuit structure comprises:
a substrate including an impurity region of a transistor;
a first interconnection connected to the impurity region of the substrate; and a first conductive bonding pad connected to the first interconnection.

19. The semiconductor memory device of claim 18, further comprising:
    a second conductive bonding pad bonded to the first conductive bonding pad; and
    a conductive pattern connecting the second conductive bonding pad to the first upper contact.

20. A semiconductor memory device comprising:
    a peripheral circuit structure;
    a lower select line above the peripheral circuit structure;
    word lines on the lower select line;
    upper select lines stacked on the word lines;
    interlayer insulating layers between the lower select line, the word lines, and the upper select lines;
    a channel layer passing through the lower select line, the word lines, the upper select lines, and the interlayer insulating layers;
    a memory layer surrounding a sidewall of the channel layer;
    a first upper contact extending from one upper select line, among the upper select lines, adjacent to the peripheral circuit structure, toward the peripheral circuit structure, wherein the first upper contact is electrically connected to the peripheral circuit structure; and
    a second upper contact extending from the one upper select line in an opposite direction compared to the first upper contact, and connecting the upper select lines to each other.

21. The semiconductor memory device of claim 20, further comprising:
    a lower contact extending from the lower select line toward the peripheral circuit structure; and
    word contacts extending from the word lines toward the peripheral circuit structure.

* * * * *